(12) United States Patent
Kida et al.

(10) Patent No.: US 7,038,195 B2
(45) Date of Patent: May 2, 2006

(54) PHOTOELECTRIC DEVICE

(75) Inventors: Shinobu Kida, Higashiosaka (JP); Jun Tatsuta, Tsu (JP); Hiroyuki Yoshida, Kyoto (JP); Mikio Masui, Kashiba (JP)

(73) Assignee: Matsushita Electric Works, Ltd., Osaka (JP)

( * ) Notice: Subject to any disclaimer, the term of this patent is extended or adjusted under 35 U.S.C. 154(b) by 48 days.

(21) Appl. No.: 10/448,283

(22) Filed: May 30, 2003

(65) Prior Publication Data
US 2004/0016873 A1  Jan. 29, 2004

(30) Foreign Application Priority Data
Jul. 25, 2002  (JP) .............................. 2002-215948

(51) Int. Cl.
*H01L 33/00* (2006.01)
(52) U.S. Cl. ........................................ 250/239; 257/98
(58) Field of Classification Search .......... 257/98–100; 250/239
See application file for complete search history.

(56) References Cited

U.S. PATENT DOCUMENTS 6,060,729 A * 5/2000 Suzuki ........................ 257/99
6,355,946 B1 * 3/2002 Ishinaga ...................... 257/98

FOREIGN PATENT DOCUMENTS

| JP | 10-98215 | 4/1998 |
| JP | 11-74420 | 3/1999 |
| JP | 2001-177155 | 6/2001 |

OTHER PUBLICATIONS

English Language Abstract of JP 2001-177155.
English Language Abstract of JP 10-98215.
English Language Abstract of JP 11-74420.

* cited by examiner

*Primary Examiner*—Thanh X. Luu
*Assistant Examiner*—Tony Ko
(74) *Attorney, Agent, or Firm*—Greeblum & Bernstein, P.L.C.

(57) ABSTRACT

In a photoelectric device-part, a bonding pad is formed without increasing a plane area of a concave part for housing a photoelectric device to implement miniaturization and improvement of the light usability efficiency. A light reflecting surface 3 of nearly a parabola configuration or the like provided for light emission and reception by a photoelectric device 5 is formed on a slanting curved surface constituting a concave part 2 of a circuit substrate 1. A convex portion 9a projecting from the light reflecting surface 3 and a receding concave portion 9b are formed in the middle of the concave part 2. A stage 9 is formed by an upper and bottom surfaces of the convex and concave portions 9a and 9b, respectively. A bonding pad 7 for connecting circuits of the photoelectric device 5 is formed at the stage 9. Since a space for the bonding pad 7 is provided by both concave and convex portions, deformation of the light reflecting surface 3 caused by the receding concave portion 9b and a ratio of intrusion to the bottom surface of the concave part by the projecting convex portion 9a can be both minimized. As a result, the photoelectric device 5 can be mounted without largely lowering light emission efficiency or without decentering the light emitting and receiving center, whereby a photoelectric device-part 10 can be miniaturized.

15 Claims, 13 Drawing Sheets

PHOTOELECTRIC DEVICE

BACKGROUND OF THE INVENTION

1. Field of the Invention

The present invention relates to a photoelectric device-part in which a photoelectric device is mounted on a concave part provided in a three-dimensional circuit substrate

2. Description of the Prior Art

Conventionally, a part which emits or receives light using a photoelectric device to convert light into electricity and vice versa is known as a photoelectric device-part. For example, a light emitting device 100 shown in FIG. 17A is a photoelectric device-part in which electrodes 105 and 106 are formed on a substrate 101, an LED (light emitting diode) chip 108 is mounted on the electrode 106 through an electroconductive bonding material 107 to electrically connect a lower surface of the LED chip 108 to the electrode 106, an upper electrode of the LED chip 108 is electrically connected to the electrode 105 by a wire bonding, and the LED chip on the substrate is covered with a case 110 having a centroclinal inner surface, whereby light output from the LED chip is all reflected (for example, Japanese Laid-Open Patent Publication No. 2001-177155).

In addition, a light emitting device 200 shown in FIG. 17B is a photoelectric device-part comprising a substrate 201 formed of almost a flat plate conductor in which a concave part 202 is formed, an insulating film 204 formed thereon, an upper electrode 205 having a wire bonding pad and an electroconductive pattern electrode 206 reaching an inner surface of the concave part 202 from an upper surface of the substrate, in which an electrode on a lower surface of an LED chip 208 is electrically connected to the pattern electrode 206 through a electroconductive bonding material 207 and an electrode on an upper surface of the LED chip 208 is electrically connected to the upper electrode 205 through a bonding wire 209 (for example, Japanese Laid-Open Patent Publication No. HEI 10-098215).

Furthermore, a surface mounting type of chip part 300 shown in FIG. 17C is a photoelectric device-part in which an insulating substrate 301 includes upper electrodes 305 and 306 and lower electrodes 315 and 316 connected thereto and an LED chip 308 is housed in a concave part 302 formed in the insulating substrate 301 (for example, Japanese Laid-Open Patent Publication No. HEI 11-74420). The concave part 302 has four slanting surfaces and a stepwise projection 303 is formed in the middle of one of the slanting surfaces. A bonding pad 325 electrically connected to the upper electrode 305 is formed on an upper surface of the projection 303. In addition, the upper electrode 306 is led to the slanting surface of the concave part 302 and to a bottom surface of the concave part 302. An electrode on a lower surface of the LED chip 308 is mounted on the bottom surface of the concave part 302 through an electroconductive bonding material 307 to be electrically connected to the upper electrode 306. An electrode on an upper surface of the LED chip 308 is electrically connected to a bonding pad 325 through a bonding wire 309. In addition, the LED chip 308 and the bonding wire 309 are sealed with a sealing resin 311.

However, according to the photoelectric device-part shown in FIG. 17A or disclosed in the patent document 1, since a space for a pad of a wire bonding is needed at the bottom surface of the case 110 having the centroclinal inner surface, there is a limit of miniaturization of the substrate. For example, when the substrate is reduced in size, an insulating space between the electroconductive bonding material 107 and the electrode 105 is reduced, which could cause a short circuit. Besides, since the bonding pad and LED chip 108 are positioned at the bottom surface of the case 110, the LED chip 108 is decentered and a light converging property is lowered.

In addition, according to the photoelectric device-part shown in FIG. 17B or disclosed in the patent document 2, since the bonding wire 209 is long, it becomes an obstacle in a light path, which lowers light emitting efficiency in the photoelectric device-part. In addition, in a case where the LED chip 208 is sealed with a resin at a later step, as a wire length increases, it is likely to be affected by expansion and contraction (thermal stress) of the resin and reliability in bonding of die wire bonding is lowered. Besides, in a case where the bonding wire is formed of Au wire, if the wire is long, the costs are increased. Furthermore, when the photoelectric device-part is used as a photoelectric signal converting device, as the bonding wire is increased, L component (inductance) of the bonding wire is increased, which prevents the signal transmission from being speeded up.

Besides, according to the photoelectric device-part shown in FIG. 17C or disclosed in the patent document 3, since it is necessary to provide an area for the stepwise projection 303 provided in the middle of the slanting surface, which limits the miniaturization of the photoelectric device-part. In addition, when the projection 303 is provided, a sectional area of the concave part 302 becomes large, which damages light converging property (usability efficiency). In addition, since the LED chip 308 is decentered, that is, not disposed at the center of the opening surface of the concave part 302, whereby light converging property is lowered.

SUMMARY OF THE INVENTION

The present invention was made to solve the above problems and it is an object of the present invention to provide a photoelectric device-part in which a bonding pad can be provided without increasing a plane area occupied by a concave part for housing a photoelectric device on a substrate and its miniaturization and light usability efficiency are improved.

In order to attain the above object, according to the present invention as set forth in claim 1, a photoelectric device-part having a metallized light reflecting surface including a slanting curved surface provided around almost the whole periphery of a light axis for light emission/reception by a photoelectric device, comprises a circuit substrate in which a concave part for housing the photoelectric device is formed, a photoelectric device mounted on a bottom surface of the concave part; and a resin layer for sealing the photoelectric device, in which the light reflecting surface is provided on an inner surface including the slanting curved surface forming the concave part, a convex portion projecting from a position of the light reflecting surface and a receding concave portion are sequentially formed in this order from the bottom surface of the concave part in the middle of the concave part at a past of the light reflecting surface in the peripheral direction, a stage is formed by an upper surface of the convex portion and a bottom surface of the concave portion, and a bonding pad for connecting circuits of the photoelectric device is provided at the stage.

According to the above constitution, the metalized light reflecting surface including a slanting curved surface around almost the whole periphery of a light axis is provided on an inner sure including the slanting curved surface forming the concave part for housing the photoelectric device, a convex portion projecting from a position of the light reflecting surface and a receding concave portion are sequentially formed in his order upwardly from the bottom surface of the concave part in the middle of the concave part at a part of the light reflecting surface in the peripheral direction, the stage is formed by the upper surface of the convex portion and the bottom surface of the concave portion, and the bonding pad for connecting circuits of the photoelectric device is provided at the stage. As a result, the bonding pad and the photoelectric device can be closely arranged.

In other words, since the bonding pad is provided at the stage positioned higher than the bottom surface of the circular concave part mounting the photoelectric device, even when the photoelectric device is mounted on the bottom surface of the concave part through an electroconductive bonding material, the bonding pad can be provided close to the photoelectric device as much as possible without worrying about electrical short circuit between the bottom surface of the concave part and the bonding pad caused by exudation of a bonding agent whereby the photoelectric device-part can be miniature Furthermore, since the space for the bonding pad is provided by the convex portion projecting from the light reflecting surface and the receding concave portion provided in the middle of the slanting curved surface, the bonding can be performed without any problem.

In addition, since the space for the bonding pad is provided by both structures of the convex portion and the concave portion, deformation of the light reflecting surface caused by the receding concave portion can be minimized. Similarly, a ratio of intrusion to the bottom sa of the concave part by the projecting convex portion can be minimized also. In other words, the photoelectric device can be mounted and the photoelectric device-part can be miniaturized without largely damaging the light reflection efficiency of the light reflecting sure and without decentering the light emitting center of the photoelectric device and the central axis of the light reflecting surface. Furthermore, since the bonding wire can be shortened, in case where the photoelectric device-part is used as a photoelectric signal converting device, a signal processing can be performed at further higher speed.

According to a photoelectric device-part of the present invention as set forth in claim 2, relating to the invention of claim 1, an insulating part for insulating the bonding pad in the vicinity of the convex portion of the sage from other electric circuits is formed at a she part continuing from the top of the convex portion to the bottom surface of the concave part for housing the photoelectric device.

According to the above constitution, since the insulating part for insulating the bonding pad in the vicinity of the convex portion is formed at the surface part continuing downwardly from the top of the convex portion to the bottom surface of the concave part for housing the photoelectric device, the whole region of the stage can be used for the bonding pad. In addition, since the insulating part is provided in three dimensions at the side surface of the convex portion rising from the bottom surface of the concave part (falling toward the bottom surface), the insulating region can be provided without using a plane part of the bottom surface and then, the photoelectric device-part can be miniaturized. Furthermore, since the insulating part is formed at an edge of the electroconductive film pattern, which is constituting the bonding pad, and which is bent from the top of the convex portion in the shape of the letter L, a peeling resistance property of the film can be improved by the L-shaped structure of the electroconductive film pattern and peeling at the time of wire bonding can be prevented.

According to a photoelectric device-part of the present invention as set forth in claim 3, relating to the invention of claim 2, the insulating part is formed by laser.

According to the above constitution, since the means for irradiating the electromagnetic wave such as laser is used for forming the insulating part, the three-dimensional insulating part can be provided without a step of exposure or patterning. For example, in a case where the insulating part for the bonding pad is formed after the electroconductive film was formed, the insulating part can be formed with high precision by irradiating the laser from the opening of the concave part onto the upper region of the side surface of the convex portion without damaging other parts.

According to a photoelectric device-part of the present invention as set forth in claim 4, relating to the invention of claim 1, the stage is nearly a circle/oval.

According to the above constitution, since the stage is nearly the circle or the oval, such configuration is compatible with the wire bond fixture and the bonding space of the stage can be minimized. In addition, in such configuration, the deformation of the light reflecting surface caused by the receding circular or oval concave portion can be minimized and the photoelectric device-part can be father miniaturized without largely damaging the light reflection efficiency of the light reflecting surface. Furthermore, in a case where the substrate material of the circuit substrate is formed by metal mold, the metal mold for forming the circular convex and concave pons is easier and costs of the photoelectric device-part can be reduced.

According to a photoelectric device-part of the present invention as set forth in claim 5, relating to the invention of claim 1, the concave part for housing the photoelectric device is provided at a top of a projecting columnar body and electric connection circuits connected to the bonding pad go through the top and an outer surface of the columnar body.

According to the above constitution, the photoelectric device-part can be miniaturized by providing the bonding pad at the stage formed in the middle of the light reflecting surface and the photoelectric device-part whose top of the columnar body is miniaturized can be provided because electric connection circuits are provided on the outer surface part of the columnar body.

According to a photoelectric device-part of the present invention as set forth in claim 6, relating to the invention of claim 1, the photoelectric device is connected to the bonding pad through a bonding wire, the sealing resin layer is formed to be high to the extent that the bonding wire is buried, and a lens layer is formed by a resin for a lens having elastic modulus larger than that of the sealing resin layer so as to cover the sealing resin layer.

According to the above constitution, since the bonding wire is buried in the sealing resin layer, the bonding wire will not cross the boundary of the sealing resin layer and the bonding wire will not be cut because of the thermal stress between layers. In addition, since the lens layer is formed by the resin for the lens having elastic modulus higher than tat of the sealing resin layer so as to cover the sealing resin layer, an influence caused by the thermal stress of the sealing resin layer is prevented by the resin layer for the lens and the light can be effectively used by its lens effect. Thus, there can be provided the photoelectric device-part with high reliability and high light usability efficiency without occureence of a cut of the bonding wire and a crack of the photoelectric device.

According to a photoelectric device-part of the present invention as set forth in claim 7, relating to the invention of claim 6, an upper surface of the sealing resin layer is a slanting curved surface so as to be higher on the side of the bonding pad.

According to the above constitution, since the upper surface of the sealing resin layer is made higher on the side of the bonding pad, the same effect as described above can be obtained when the bonding wire can be buried and sealed with small amount of sealing resin layer. In addition, since the sealing layer and the lens layer can be formed using the resin for the lens having high optical characteristic, there can be provided the photoelectric device-part with high light usability. Furthermore, in a case where the sealing resin material for sealing photoelectric device and the bonding wire connected to the photoelectric device is expensive, the amount of the resin can be minimized and there is an effect tat a photoelectric device-part with high reliability and high light usability efficiency can be provided at a low price.

A photoelectric device-part according to the present invention as set forth in claim 8, relating to the invention of claim 1, has a portion in which a substrate material of the circuit substrate is exposed on the bottom surface of the concave part for housing the photoelectric device.

According to the above constitution, since the portion in which the substrate material is exposed is formed on an extended surface of the light reflecting surface, the metalized surface of the bottom surface of the concave part having the circuit patterns for electrically connecting to the lower electrode of the photoelectric device, the sealing resin layer to be filled in the concave part and the resin of the material of the circuit substrate are directly connected to each other at the exposed portion. Therefore, stronger bonding force of the sealing resin is provided as compared with the bonding through the metalized surface.

According to a photoelectric device-part of the present invention as set forth in claim 9, relating to the invention of claim 8, a grove in which the substrate material is exposed is formed at the bottom surface of the concave part for housing the photoelectric device and the sealing resin is poured in the groove.

According to the above constitution, since the groove is formed and the sealing resin layer is implanted in the groove, in addition to the above effect, since a bonding area between the sealing resin layer and the substrate material is increased, further stronger bonding force of die sealing resin layer can be obtained.

According to a photoelectric device-part of the present invention as set forth in claim 10, relating to the invention of claim 1, the concave part for housing the photoelectric device is provided at a top of the projecting columnar body, a lens layer is formed with a resin for the lens having elastic modulus higher than that of the sealing resin layer so as to cover the sealing resin layer, and the resin for the lens covers an outer surface of the projecting columnar body.

According to the above constitution, since the resin constituting the lens layer covers the outer surface of the projecting columnar body, it is not necessary to form a layer for protecting a electrical connection circuit on the outer surface separately. As a result, the electrical connection circuit on the outer surface can be surely covered and protected by the extended lens layer resin having no boundary. Furthermore, there is a large space for the bonding interface between the lens resin and the circuit substrate resin. Therefore, moisture absorption to the inside of the sealing layer through the interface can be reduced and the photoelectric device can be prevented from deteriorating. Still further, since the inner sealing resin layer is surrounded by the resin layer rigidly formed, separation between the sealing resin layer and the lens layer can be prevented.

According to a photoelectric device-part of the present invention as set forth in claim 11, relating to the invention of claim 1, the lens layer is formed with a resin for a lens having elastic modulus higher than that of the sealing resin layer so as to cover the sealing resin layer, the lens layer is formed by hardening the resin for the lens and cooled down from a hardening temperature to a room temperature at cooling speed lower than that of a room temperature cooling.

According to the above constitution, since the resin forming the lens layer was hardened and then, it is cooled down from the hardening temperature to a room temperature at cooling speed lower than that of the room temperature cooling, it can be cooled down while thermal stress is reduced by controlling the cooling time. Therefore, there can be provided the photoelectric device-part in which the separation of the resin interface or a crack in the resin caused by rapid shrinkage can be prevented from occurring.

According to a photoelectric device-part of the present invention as set forth in claim 12, relating to the invention of claim 1, the substrate material of the circuit substrate is formed with a resin having low elastic modulus of 10 GPa or less, the sealing resin layer comprises a first sealing layer for sealing the photoelectric device with a resin whose elastic modulus is 1 Pa or more and 1 MPa or less and glass-transition temperature is 213 K or more and 233 K or less; and a second sealing layer formed on the first sealing layer with an ultraviolet ray hardening resin whose elastic modulus is 1 GPa or more and 2.5 GPa or less and glass-transition temperature is more than 413 K or more, and a lens layer is formed on said second sealing layer with a resin for a lens whose elastic modulus is 3 GPa or more.

According to the above constitution, since the substrate material is formed with the resin having low elastic modulus of 10 GPa or less, the first sealing layer is formed with the resin whose elastic modulus is 1 Pa or more and 1 Mpa or less and glass-transition temperature is 213 K or more and 233 K or less, the second sealing layer is formed with the ultraviolet ray hardening resin whose elastic modulus is 1 GPa or more and 2.5 GPa or less and glass-transition temperature is 413 K or more, lens layer is formed with the resin for a lens whose elastic modulus is 3 GPa or more and these are formed in this order, the stress of the sealing resin is comprehensively relieved by selectively and appropriately selecting the elastic modulus of the resin constituting the photoelectric device-part. As a result, resistance reliability of the optical device can be provided according to the change of the temperature circumstances. Furthermore, by a synergistic effect with stress relaxation between sealing resins, and the surface bonding force, there can be provided the photoelectric device-part with high resistance reliability in which a vacuum void in the resin and separation of the resin surface will not occur in a temperature circumstance of 233 K (−40° C.) to 358 K (85° C.) at which the photoelectric device-part was put.

For example, the thermal shock test was performed under the condition that 233 K (−40° C.)×5 minutes and 358 K (85° C.)×5 minutes as one cycle. As a result of the thermal shock t all were nondefective until 700 cycles. As the case other than the condition of the above-mentioned elastic modulus and the glass-transition temperature, for example, in a case where the elastic modulus of the first sealing layer is 1 Pa or less and glass-transition temperature is 213 K or less, as a result of the thermal shock test, a vacuum void is generated in the resin of the first sealing layer and becomes the obstacle in the light path, Alternatively, in a case where the elastic modulus of the first sealing layer is 1 Mpa or more and the glass-transition temperature is 233 K or more, as a result of the thermal shock test, the interface between the first sealing layer and the metalized surface of the concave part of the circuit substrate (a circuit pattern for electrically connecting to the lower electrode of the photoelectric device) is separated and becomes the obstacle in the light path. Alternatively, in a case where the elastic modulus of the second sealing layer is 1 GPa or less and the glass-transition temperature is 413 K or less, as a result of the thermal shock test, a vacuum void is generated in the resin of the second sealing layer and becomes the obstacle in the light path. Alternatively, in a case where the elastic modulus of the second sealing layer is 2.5 GPa or more, as a result of the thermal shock test, the interface between the second sealing layer and the metalized surface of the concave part of the circuit substrate is separated and becomes the obstacle in the light path. Alternatively, in a case where the elastic modulus of the resin for the lens layer is 3 GPa or less, as a result of the thermal shock test, the interface between the second sealing layer and the lens layer is separated and becomes the obstacle in the light path.

According to a photoelectric device-part of the present invention as set forth in claim 13, relating to the invention of claim 12, the first sealing layer and the second sealing layer are formed by dropping the resin for the first sealing layer, dropping the resin for the second sealing layer whose specific gravity is smaller than that of the resin for the first sealing layer thereon, and hardening those resins.

According to the above constitution, since the resin for the first sealing layer is dropped, the resin for the second sealing layer whose specific gravity is smaller than that of the resin for the first sealing layer is dropped thereon, and the two resins are hardened, the interface of the two sealing resin layers is formed in a liquid state. Thus, they are melted with each other and the bonding force is improved because the interface of the resins is chemically bonded when the two sealing resin layers are hardened. In addition, since the resin having specific gravity smaller an that of the resin for the lower layer is used for the upper layer, the resins are not mixed.

According to a photoelectric device-part of the present invention as set forth in claim 14, relating to the invention of claim 1, the substrate material of the circuit substrate is formed with a resin having low elastic modulus of 10 GPa or less, the sealing resin layer is formed with a resin whose elastic modulus is 2.5 GPa or more and 3.5 GPa or less and glass-Edition temperature is 413 K or more, and a lens layer is formed with a resin for a lens whose elastic modulus is 3 GPa or more, on the sealing resin layer.

According to the above constitution, since the substrate material of the circuit substrate is formed of the resin having low elastic modulus of 10 GPa or less, the sealing resin layer is formed of the resin whose elastic modulus is 2.5 GPa or more and 3.5 GPa or less and glass-transition temperature is more than 413 K or more, a lens layer is formed of the resin for a lens whose elastic modulus is 3 GPa or more, and these are formed in this order, the stress of the sealing resin is comprehensively relieved by selectively and appropriately selecting the elastic modulus of the resin constituting the photoelectric device-part. As a result, resistance reliability of the optical device can be provided according to the change of the temperature circumstances. Furthermore, by a synergistic effect with stress relaxation between sealing resins, and the surface bonding force, there can be provided the photoelectric device-part with high resistance reliability in which a vacuum void in the resin and separation of the resin she will not occur in a temperature circumstance of −40° C. to 85° C. at which the photoelectric device-part was put.

For example, the thermal shock test was performed under the condition that 233 K (−40° C.)×5 minutes and 358 K (85° C.)×5 minutes as one cycle. As a result of the thermal shock test all were nondefective until 500 cycles. As the case other than the condition of the above-mentioned elastic modulus and the glass-transition temperature, for example, in a case where the elastic modulus of the first sealing layer is 2.5 GPa or less and glass-transition temperate is 413 K or less, as a result of the thermal shock test, a vacuum void is generated in the resin and becomes the obstacle in the light path. Alternatively, in a case where the elastic modulus of the fast sealing layer is 3.5 GPa or more, as a result of the thermal shock test, the interface between the sealing resin layer and the metalized surface of the concave part of the circuit substrate is separated and becomes the obstacle in the light path. Alternatively, in a case where the elastic modulus of the lens layer resin is 3 GPa or less, as a result of the thermal shock test the interlace between the sealing resin layer and the lens layer resin is separated and becomes the obstacle in the light path.

According to a photoelectric device-part of the present invention as set forth in claim 15, relating to the invention of claim 14, the sealing resin layer and the lens layer are formed by dropping the resin for the sealing resin layer, filling the resin for the lens under the condition that the degree of cross-linking of the resin for the sealing resin layer is 50 to 80% and hardening those resins.

According to the above constitution, since the resin for the lens is filled under the condition that the degree of cross-linking of the resin for the sealing resin is 50 to 80% and those resins are hardened the sealing resin for the lower layer of he lens layer is hardened by a hardening agent for the lens resin and chemical bonding between the lens resin and the sealing resin is formed. Therefore, the bonding force between the lens layer and the sealing resin layer is improved.

DESCRIPTION OF THE PREFERRED EMBODIMENT

Figure 1:
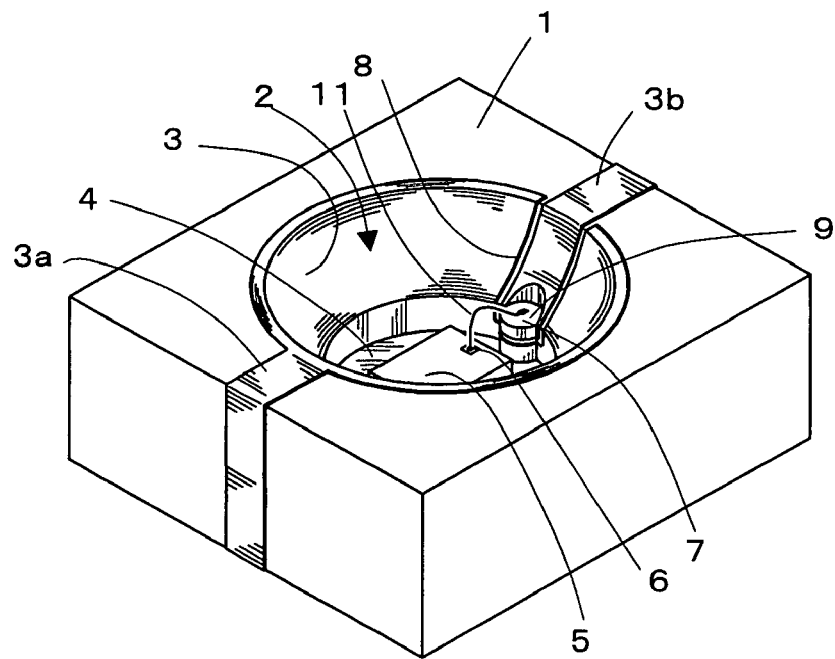
FIG. 1 is a perspective view showing a state where a sealing resin layer of a photoelectric device-part is removed according to one embodiment of the present invention.
Figure 2:
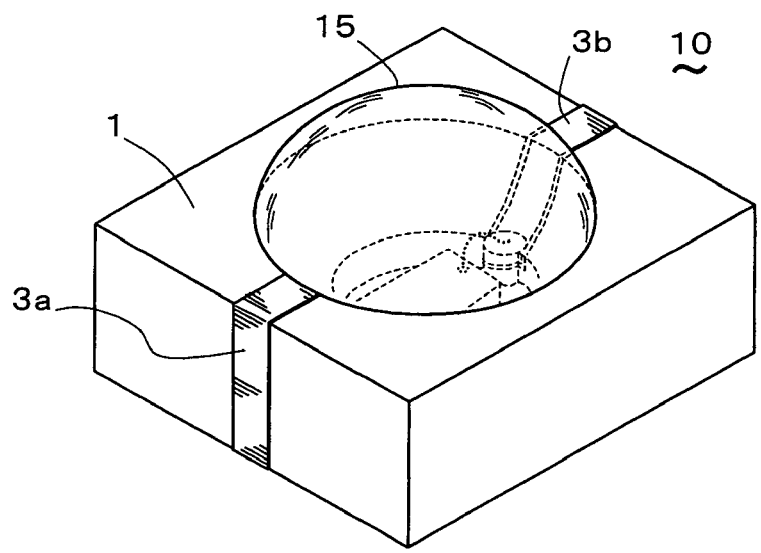
FIG. 2 is an external perspective view showing the above photoelectric device-part.

Hereinafter, a photoelectric device-part according to an embodiment of the present invention will be described with reference to accompanied drawings. FIG. 1 shows a state in which a sealing resin layer of the photoelectric device-part is excluded and FIG. 2 is an external view showing the photoelectric device-part. A photoelectric device-part 10 is formed by mounting a photoelectric device 5 on a bottom surface 4 of a concave part 2 formed in a quadrangular circuit substrate 1, which is used as a light emitting or receiving device such as a photo connector. A light axis is defined in almost a center of a light emitting or receiving she of the photoelectric device 5 in the vertical direction. A metalized light reflecting surface 3 provided for light emission or reception by the photoelectric device 5 is formed on inner surface including a slanting curved surface which forms the concave part 2.

This light reflecting surface 3 is formed by providing the slanting curved surface having a light converging property of high light usability efficiency and formed of almost parabola or conical concave configuration for example, around almost the whole periphery of the light ads. The photoelectric device 5 is arranged in such a manner that a light emitting or receiving center of the photoelectric device 5 is positioned nearly at a light converging point by the light reflecting surface 3. The light reflecting surface 3 is generally optically designed to have an aspheric configuration using computer processors in such a manner that desired high light usability efficiency can be obtained in combination with angle distribution of a light flux from the light emitting and receiving surface of the photoelectric device 5. The light reflecting surface 3 is formed using data of light reflecting surface configuration generated by such design. A stage 9 formed in the middle of the slanting cured surface, including the middle of the slanting curved surface and a little lower part from the lower end of the slanting curved spice, at a part of the light reflecting surface 3 in the peripheral direction is provided, with a bonding pad 7 for connecting circuits of the photoelectric device 5.

The light reflecting surface 3 is met by an electroconductive film and formed nearly on the whole inner surface, including a bottom surface 4, of the concave part 2 for housing the photoelectric device. In addition, the electroconductive film forms an electric circuit pattern and comprises two regions electrically insulated by an insulating part 8, which are extended to an outer surface of the circuit substrate 1 to be connected to wirings 3a and 3b.

Furthermore, a resin layer for sealing the photoelectric device 5 (referred to as a sealing resin layer hereinafter) is formed at the concave part 2 and a lens layer 15 is formed thereon. The sealing resin layer protects the photoelectric device 5 and the bonding wire 11 in which a resin having a light transmittance property such as epoxy resin or the like is used. The circuit substrate 1 is in three dimensions having a thickness and formed of a substrate material such as an LCP resin (liquid crystal polymer) or a PPA resin (polyphtalamide resin). Such three-dimensional substrate material is formed by injection molding and a three-dimensional circuit is formed thereon, which becomes a three-dimensional circuit part called MID (Molded Interconnect Device). Although there are one-shot molding method and two-shot molding method which are well known in the MID, the one-shot molding method by which a circuit is formed using laser is especially suitable for manufacture of a small precision part having a structure according to the present invention. In addition, the substrate material may contain a filler or may be a material other than a substrate formed of resin such as a ceramic substrate or a substrate in which a metal body is covered with the insulating layer.

Then, the photoelectric device 5 will be described. The photoelectric device 5 is a light emitting device such as LED (light-emitting diode), a light receiving device such as a photodiode, or a photoelectric device composed of those. The photoelectric device 5 emits light from its upper surface toward an upper opening of the concave part 2 or receives light from the upper opening of the concave part 2 at the upper surface of the photoelectric device 5. The photoelectric device 5 has electrodes on its upper and lower surfaces. The lower electrode of the photoelectric device 5 is electrically connected to the light reflecting surface 3 by a electroconductive bonding material 12 (referring to FIG. 4) such as a silver paste or a solder, for example on the bottom she 4 of the concave part 2. Thus, the lower electrode of the photoelectric device 5 is drawn out to the wiring 3a formed from the upper end she of the circuit substrate 1 to its side surface and its back surface (not shown) through a circuit pattern of the electroconductive film forming the light reflecting surface 3. An upper electrode 6 of the photoelectric device 5 is connected to the bonding pad 7 by a bonding wire 11 made of gold, for example. Therefore, the upper electrode 6 of the photoelectric device 5 is drawn out to the wiring 3b formed from the upper surface of the circuit substrate 1 to its side surface and its back surface (not shown).

Figure 3:
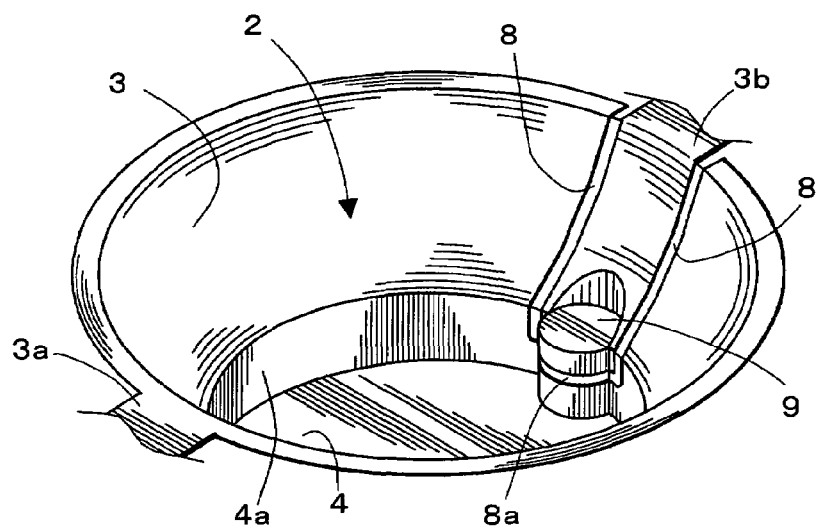
FIG. 3 is a peeve detailed view showing a concave part of a circuit substrate of the above photoelectric device-part.
Figure 4:
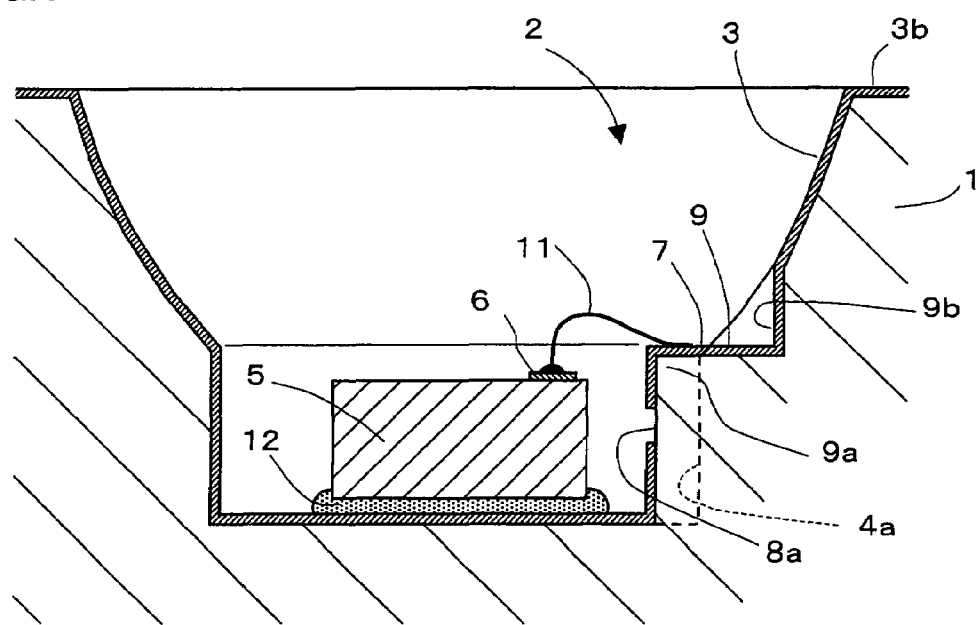
FIG. 4 is a sectional view for explaining a stage of the above photoelectric device-part.

Then, the bonding pad 7 will be described. FIG. 3 illustrates in detail the concave part of the circuit substrate in which the photoelectric device is housed and FIG. 4 illustrates the stage 9 formed for providing the wire bonding pad. At a middle portion of the slanting curved surface in a part of the light reflecting surface 3 in the peripheral direction, a convex portion 9a projecting from a surface of the light reflecting surface 3 and a receding concave portion 9b are sequentially formed upwardly from the bottom surface 4 of the concave part 2. A side surface of the convex portion 9a rises from the bottom surface 4 of the concave part 2 and projects from a lower side wall 4a to the central portion of the concave part 2. The stage 9 is formed by an upper surface of the convex portion 9a and a bottom surface of the concave portion 9b. The bonding pad 7 for connecting circuits of the photoelectric device 5 is formed at the stage 9. The bonding pad 7 is electrically isolated from the neighboring electodoncutive film which forms the light reflecting surface 3 by insulating parts 8 and 8a and connected to the wiring 3b. The bonding pad 7 is provided so as to be positioned higher than the upper surface of the photoelectric device 5. In addition, the bonding wire 11 is bonded such hat its maximum height is lower than the opening position of the concave part 2. Furthermore, a position of the stage 9 may be at a lower end of the slanting curved surface or a little lower than it and it is formed such that at least the concave portion 9b is formed using a part of the slanting curved surface of the light reflecting surface 3.

As described above, since a space for the bonding pad 7 is provided by both structures of the convex portion 9a and the concave portion 9b, deformation of the light reflecting surface 3 of nearly a parabola configuration or the like caused by the receding concave portion 9b can be minimized. Similarly, a ratio of intrusion to the bottom surface of the concave part by the projecting convex portion 9a can be mini also. In other words, the photoelectric device 5 can be mounted and the photoelectric device-part 10 can be miniaturized without largely damaging a light reflection efficiency of the light reflecting surface 3 corresponding to the light converging property and a light converging amount, that is, the light usability efficiency, and without decentering the light emitting and receiving center of the photoelectric device 5 and the central axis of the light reflecting surface 3 of nearly the parabola configuration or the like. Furthermore, since the bonding wire 11 can be shortened, in case where the photoconductive device-part 10 is used as a photoelectric signal converting device, a signal processing can be performed at further higher speed.

Then, the insulating part 8a will be described. The insulating part 8a insulating the bonding pad 7 in the vicinity of the convex portion 9a of the stage 9 is formed on a surface continuing from an edge of the convex portion 9a to the bottom surface 4 of the concave part 2 for housing the photoelectric device. Since the insulating part 8a is provided in three dimensions using the side surface of the convex portion 9a rising from the bottom surface 4 of the concave part 2 (falling toward the bottom surface 4), an insulating region can be provided without using a plane part of the bottom spice 4, so that the photoelectric device-part can be miniaturized. Furthermore, since the insulating part 8a is formed at an edge of the electroconductive film pattern constituting the bonding pad 7, and which is bent from the top of the convex portion 9a in the shape of the letter L, peeling resistance of the film can be improved by the L-shaped structure of the electroconductive film pattern and peeling at the time of wire bonding can be prevented.

Although it is difficult to form the insulating part including the rising side surface by using patterning with a mask exposure method for example, it can be formed using means for irradiating electromagnetic wave such as laser in such a manner that the irradiation positions and angles of the laser are changed as drawn with a single stroke of the brush. In addition, since the three-dimensional insulating part is formed with high precision to be several tens of μm in width by the laser, an area loss of the light reflecting surface can be decreased. For example, in a case where the insulating part of the bonding pad provided at the stage is formed after the electroconductive film was formed, the insulating part can be formed with high precision without damaging other parts by irradiating the laser from the opening of the concave part to the end of the side surface of the convex portion.

The configuration of the stage may be nearly a circle or nearly an oval and the whole region of the stage can be effectively used as a bonding region. Such configuration is compatible with the wire bond fixture and the bonding space of the stage can be minimized. In addition, in such configuration, the deformation of the light reflecting surface caused by the receding concave portion can be minimized and the photoelectric device-part can be further miniaturized without largely damaging the light reflection efficiency of the light reflecting surface. Furthermore, in a case where the substrate material of the circuit substrate 1 is formed by metal mold, the metal mold for forming the circular convex and concave portions is easier and costs of the photoelectric device-part can be reduced.

Description will be made of a manufacturing method of the substrate material of the circuit substrate 1 and a forming method of the light reflecting surface 3 on its surface. First, the substrate material having the concave part 2 for housing the photoelectric device and the convex portion 9a and the concave portion 9b at its slanting curved surface is manufactured by resin molding under conditions shown in the following table 1, for example.

TABLE 1

| | Resin molding conditions | |
|---|---|---|
| | Molding material | PPA (Aromatic polyamide) |
| Molding conditions | Cylinder temperature | 300–350° C. |
| | Metal mold temperature | 100–200° C. |
| | Injection speed | 5–80 mm/sec |

Then, an electroconductive base film is formed by sputtering, vapor deposition or the like over the whole inner surface of the concave part 2 for housing the photoelectric device including the convex and concave portions 9a and 9b of the light reflecting surface 3, and the whole region in which the electric circuit patterns such as the wirings 3a and 3b are formed.

Then, the base film is patterned by evaporating an unnecessary part of the base film to be removed by irradiation of the laser, for example, whereby a conductive part and an insulating part are formed. Then, by plating the conductive part, there are formed light reflecting surface 3 and wirings 3a and 3b each having desired thickness and light reflecting property. The patterning also can be performed after the film having the final film thickness was formed by plating or the like. However, if the patterning is performed by the laser processing, the processing to form three-dimensional configuration becomes easy. In general, the film of the light reflecting spice 3 is formed of a copper film (thickness is 0.1 to 0.5 μm). In this case, SHG-YAG layer (wavelength is 532 nm) is preferably used.

Furthermore, it is preferably that the light reflecting surface 3 and the bonding pad 7 are plated by Ni and Au on the copper film. A size of the bonding pad 7 ranges from φ0.3 to 1.0 mm in general and it is φ0.3 to 0.5 mm in this embodiment because of miniaturization. The thickness of the Au plated layer of an upmost layer is preferably ranges from about 0.3 to 1.0 μm.

According to thus formed photoelectric device-part of the present invention, since the stage 9 is formed at a slanting curved surface of the concave part 2 for housing the photoelectric device, the bonding pad 7 can be provided without increasing a plane area of the concave part 2 for housing the photoelectric device thus the circuit substrate 1, thereby to miniaturize the photoelectric device-part. Furthermore, since a part of the light reflecting surface 3 can be used as the conductive part for connecting the bonding pad 7 to the wiring 3b, the slanting curved surface (light reflecting surface 3) of the concave part 2 for housing the photoelectric device can be effectively used. Besides, since it is almost not necessary to change the configuration of the concave part 2, a preferable light reflecting surface with nearly the parabola configuration or nearly the conical concave configuration formed around the light axis can be maintained. As a result, preferable light usability efficiency can be obtained.

Figure 5:
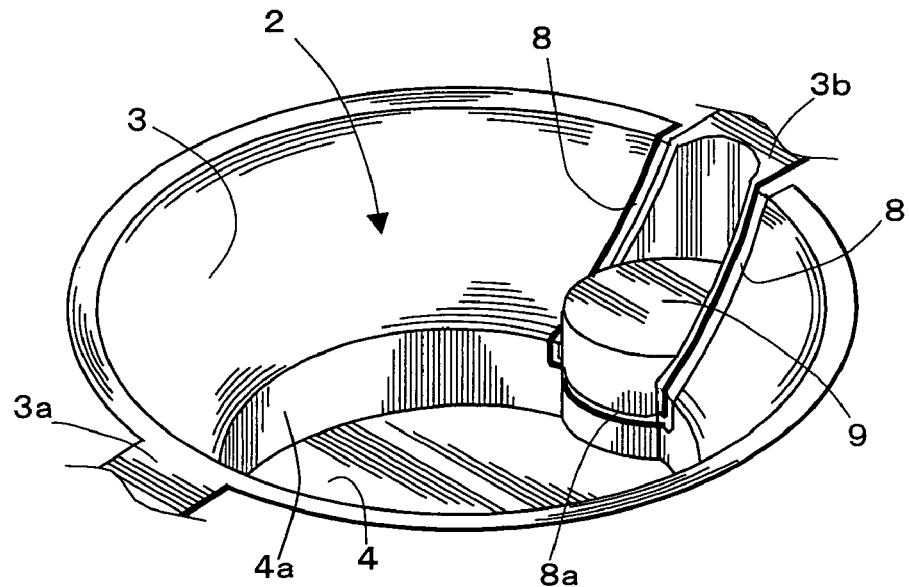
FIG. 5 is a perspective detailed view showing a concave part of a circuit substrate of another photoelectric device-part according to one embodiment of the present invention.
Figure 6:
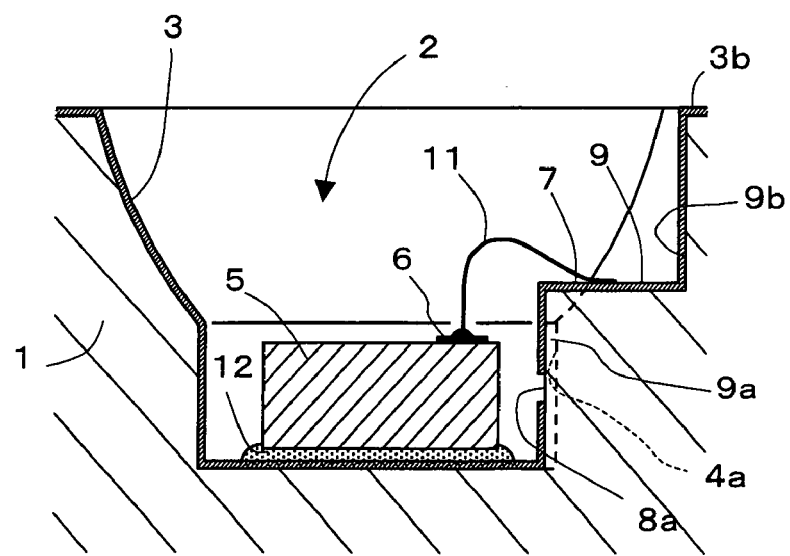
FIG. 6 is a sectional view for explaining a stage of the above photoelectric device-part.

In addition, as shown in FIGS. 5 and 6, in a case where the photoelectric device-part is extremely miniaturized, almost all of the slanting curved surface of the wiring part 3b may be replaced with a vertical side surface of the concave portion 9b as a variation of this embodiment of the present invention. In this case, a diameter of the concave part 2 is smaller than that of the photoelectric device-part shown in FIGS. 3 and 4. Thus, the projection amount of the side surface of the convex portion 9a from the lower side wall 4a of the concave part 2 toward the central portion is reduced but the receding amount of the concave portion 9b is increased.

Figure 7:
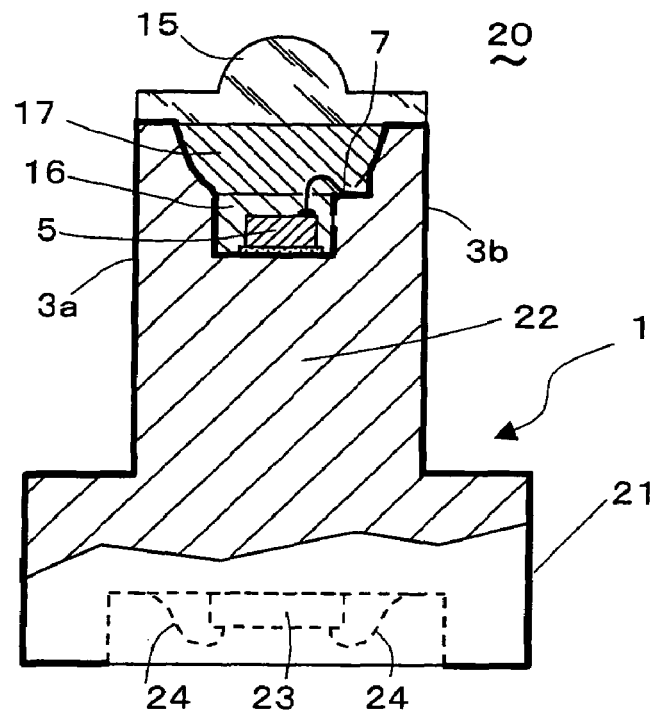
FIG. 7 is a sectional view showing a still another photoelectric device-part according to one embodiment of the present invention.
Figure 8:
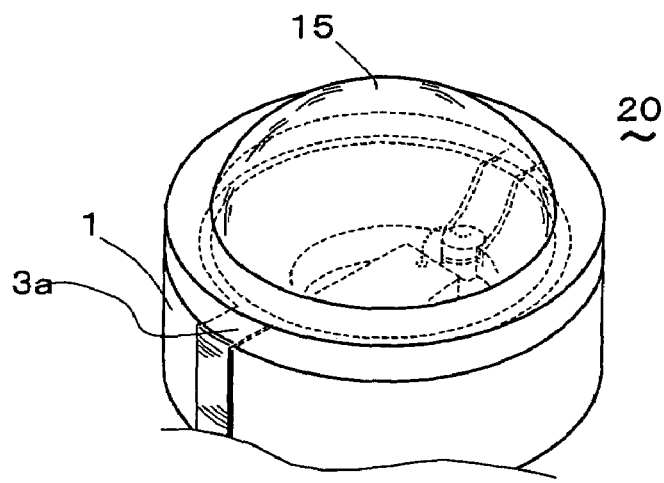
FIG. 8 is an external perspective view showing the top of a columnar body of the above photoelectric device-part.
Figure 9A:
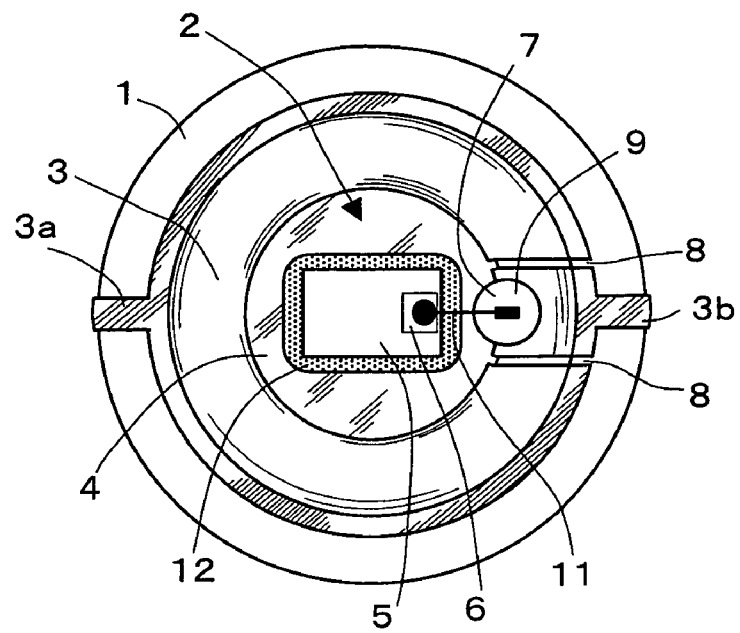
FIG. 9A is a plan view showing the above photoelectric device-part from which a sealing resin layer of is removed.
Figure 9B:
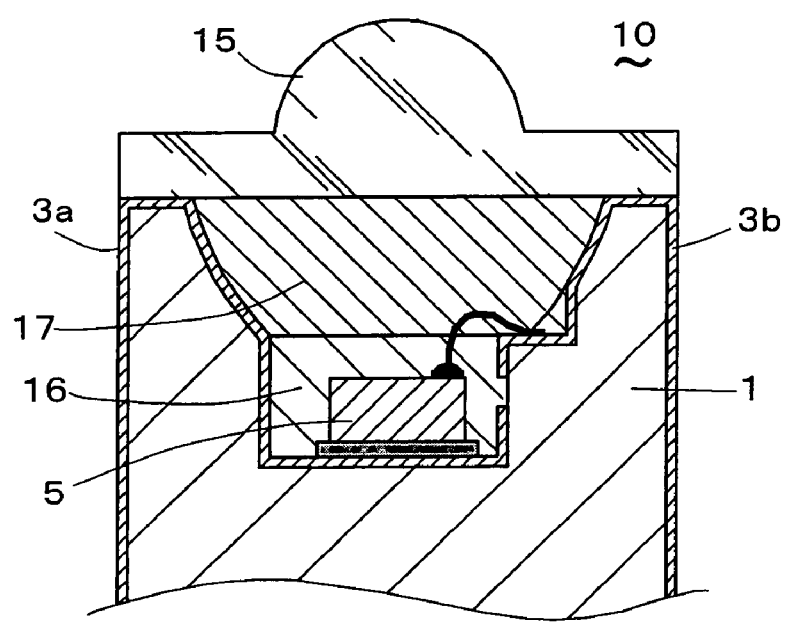
FIG. 9B is a sectional view showing the above photoelectric device-part.

Then, another photoelectric device-part according to one embodiment of the present invention will be described. FIG. 7 illustrates a photoelectric device-part 20 having a columnar configuration and FIG. 8 illustrates an em view showing a top of the columnar body. In addition, FIG. 9A is a plan view showing a state in which a sealing resin layer of the photoelectric device-part 20 is removed and FIG. 9B illustrates the columnar body in detail. A circuit substrate 1 of the photoelectric device-part 20 is composed of a quadrangular substrate base 21 and a columnar body 22 projecting from the substrate base 21. A concave part for housing a device is provided at the top of the columnar body 22. A stage structure on which the bonding pad 7 is formed and a concave part structure for housing the device are the same as those of the photoelectric device-part 10.

A lower electrode of the photoelectric device 5 and wirings 3a and 3b to the bonding pad 7 go through the top and peripheral part of the columnar body 22. The wiring 3a and 3b go through as follows, for example. For example, an integrated circuit device 23 for performing signal processing of the photoelectric device 5 is mounted at the concave part formed at the lower surface of the quadrangular substrate base 21. The photoelectric device 5 and the integrated circuit device 23 are connected through the wirings 3a and 3b and the bonding wire 24. The wirings 3a and 3b are formed on the surface of the three-dimensional circuit molded part composed of the substrate base 21 and the columnar body 22 with a metal plated film, for example in such a manner that they reach the mounting portion of the integrated circuit device 23 from the concave part on which the photoelectric device 5 was mounted.

The photoelectric device-part 20 is constituted such that the photoelectric device 5 is mounted on the concave part at the top of the column body 22 and then, sealed by two kinds of sealing resin layers and a lens layer 15 is formed thereon so as to be opposed to the light receiving surface or the light emitting surface of the photoelectric device 5. According to such photoelectric device-part 20, the photoelectric device-part can be miniaturized by providing the bonding pad 7 at the stage 9 formed in the middle of the light reflecting surface, and the photoelectric device-part whose top of the columnar body is miniaturized can be provided because an electric connection circuit is provided on the outer surface part of the columnar body 22.

A material constitution and a sealing structure of the photoelectric device-part 20 will be described. The substrate material of the circuit substrate 1 is a resin substrate which is formed of low elastic modulus resin having a material property in which elastic modulus is 10 GPa or less. Meanwhile, even if the sealing resin can be used with the resin substrate formed of high elastic modulus resin such as glass epoxy resin, for example whose elastic modulus exceeds 10 GPa, if such a sealing resin is used with the low elastic modulus substrate whose elastic modulus is not more than 10 GPa, separation is likely to occur at layer boundary between the photoelectric device and the sealing resin layer at the time of beating and cooling of lens resin molding. Then, if the sealing resin layer having high elastic modulus is used to prevent separation between the photoelectric device and the sealing resin layer, an electroconductive bolding material between the photoelectric device and the circuit substrate is likely to be separated and also the photoelectric device is likely to be damaged.

Therefore, in order to prevent the above separation at the resin substrate formed of low elastic modulus resin having a material property in which the elastic modulus is 10 GPa or less, the following structure is provided. The sealing resin layer is composed of a first sealing layer 16 and a second sealing layer 17. The first sealing layer 6 for sealing the photoelectric device 5 and the whole or a part of the bonding wire 11 is formed of resin whose elastic modulus is 1 Pa or more and 1 MPa or less and glass-transition temperature is 213 K or more and 233 K or less. As the resin of the first sealing layer 3, in addition to modified acrylate resin, the epoxy resin may be used, for example. The second sealing layer 17 formed on the first sealing layer 16 is formed of ultraviolet rays (UV) hardening resin whose elastic modulus 1 GPa or more and 2.5 GPa or less and glass-transition temperature is 413 K or more. As the ultraviolet rays hardening resin of the second sealing layer 17, in addition to the epoxy resin the modified acrylate resin may be use for example. The lens layer 15 formed on the second sealing layer 17 is formed of resin whose elastic modulus is 3 GPa or more. As the resin of the lens layer 15, in addition to the epoxy resin, the modified acrylate resin nay be used, for example.

Figure 10:
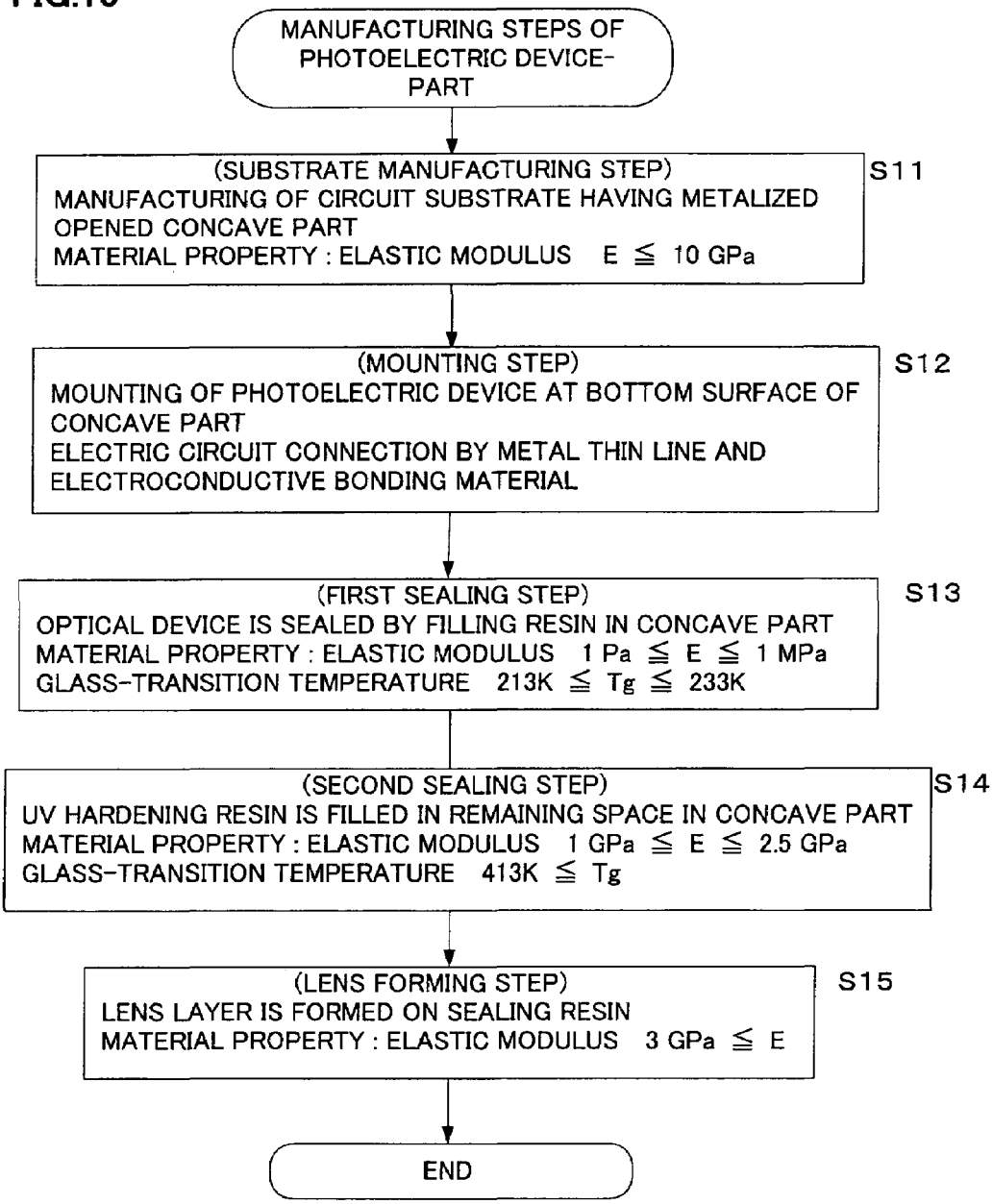
FIG. 10 is a view showing a flow of steps of a manufacturing method of the above photoelectric device-part.

Manufacturing steps of the photoelectric device-part 20 will be described FIG. 10 shows a flow of the steps. Referring to FIG. 9 again, the substrate material of the circuit substrate 1 including the concave part 2 for housing the photoelectric device and the stage 9 for the wire bonding pad 7 is manufactured by resin molding and an inner surface of the concave part and its outer are metalized to form patterns of the light reflecting sub 3 and the wirings 3a and 3b at step S11. Then, the photoelectric device 5 is die-bonded on the bottom surface 4 of the concave part 2 through a bonding material 12 such as electroconductive resin, for example and the upper surface electrode 6 of the photoelectric device 5 is connected to the bonding pad 7 through the bonding. wire (meal thin line) 11 at step S12. Then, the resin for the first sealing layer 16 is filled in the concave part 2 to perform a first sealing process at step S13. Then, the UV hardening resin which is the resin for the second sealing layer 17 is filled in the remaining space in the concave part 2 to perform a second sealing process at step S14. Then, the lens layer 15 is formed on the second sealing layer at step S15. If as a method of forming the lens layer 15 a transfer molding method is used, for example, a configuration and surface precision of the lens layer 15 can be molded with high precision.

A thermal shock test was performed on the photoelectric device-part 20 having multilayer sealing structure manufactured by the above steps. In this case, the UV hardening resin was used also in the first sealing layer. As a comparative example, there was manufacture a photoelectric device-part having a single sealing structure in which the photoelectric device 5 was sealed and the lens layer was formed with only resin for the lens layer. Then, the same thermal shock test was performed on his comparative example. Material properties and hardening conditions of the resin used are shown in a table 2.

TABLE 2

Material properties and hardening conditions of used resin

| | Resin | Elastic modulus | Glass-transition temperature | Hardening conditions |
|---|---|---|---|---|
| Lens part | Epoxy | 3200 MPa | 398 K | 423 K 180 seconds |
| Second sealing layer | Epoxy | 1200 MPa | 433 K | 6 J/cm² (UV) |
| First sealing layer | Modified acrylate | 1 MPa | 233 K | 4.5 J/cm² (UV) |

The thermal shock test was performed in a liquid phase. One cycle was such that 233 K (−40° C.)×5 minutes and 358 K (85° C.)×5 minutes. As a result of the thermal shock test, the multilayer photoelectric device-part 20 according to the present invention were all nondefective out of twenty after 700 cycles. Meanwhile, according to the comparative example of single structure of the lens layer resin, separation occurred between the lens layer resin and the photoelectric device and all were defective before 700 cycles.

As described above, stress of the sealing resin is comprehensively relieved by selectively and appropriately selecting the elastic modulus of the resin constituting the photoelectric device-part 20. Furthermore, by a synergistic effect with the interface bonding force, there can be provided the photoelectric device-part with improved resistance reliability in which a vacuum void in the resin and separation of the resin interface will not occur in a temperature circumstance of −40° C. to 85° C. at which the photoelectric device-part was put.

In addition, according to the above manufacturing steps, after the sealing resin for the first layer was dropped a little to the extent that the photoelectric device 5 is covered and hardened, the sealing resin for the second layer was dropped and hardened. Thus, an influence of volume change caused by the high linear expansion coefficient of the first layer resin can be prevented. Regarding to this respect, the additional thermal shock test confirmed that a defective fraction caused by the vacuum void in the resin and the separation of the resin interface was reduced.

Figure 11A:
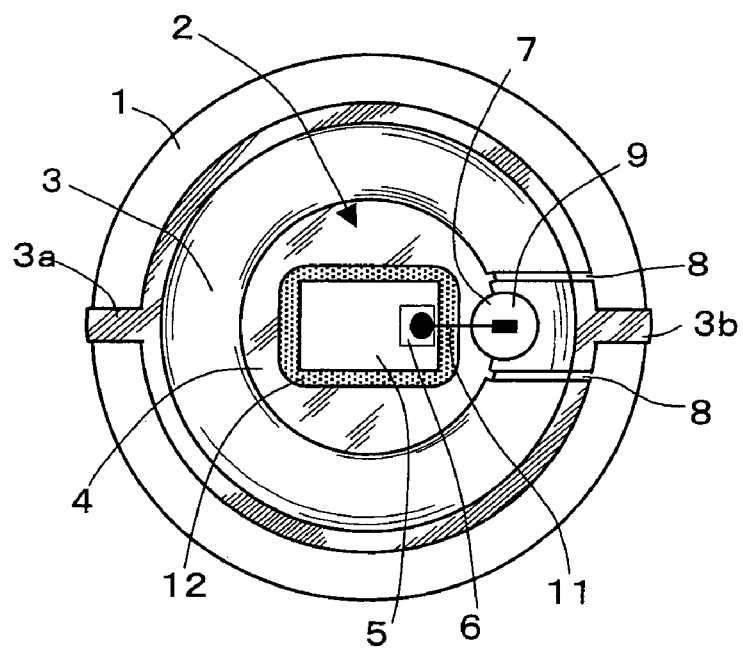
FIG. 11A is a plan view showing still another photoelectric device-part according to one embodiment of the present invention from which a sealing resin is removed.
Figure 11B:
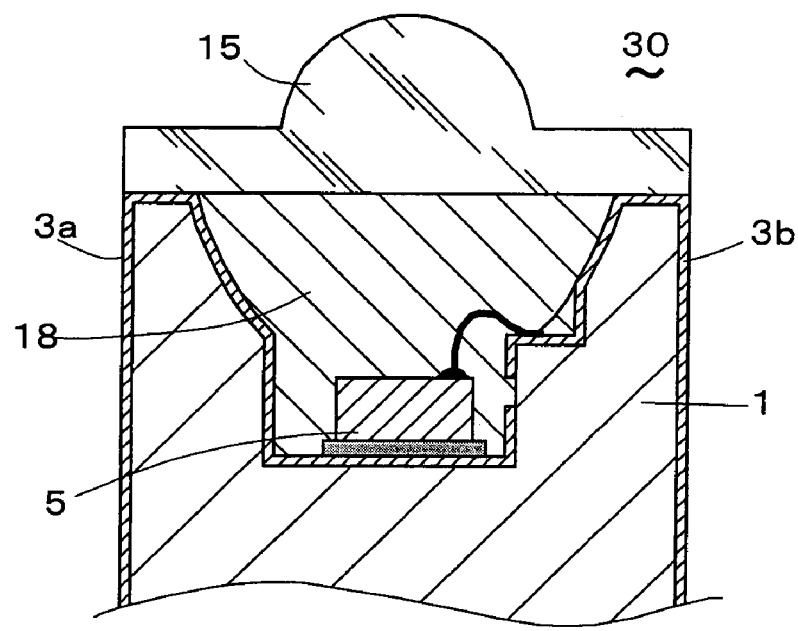
FIG. 11B is a sectional view showing the above photoelectric device-part.
Figure 12:
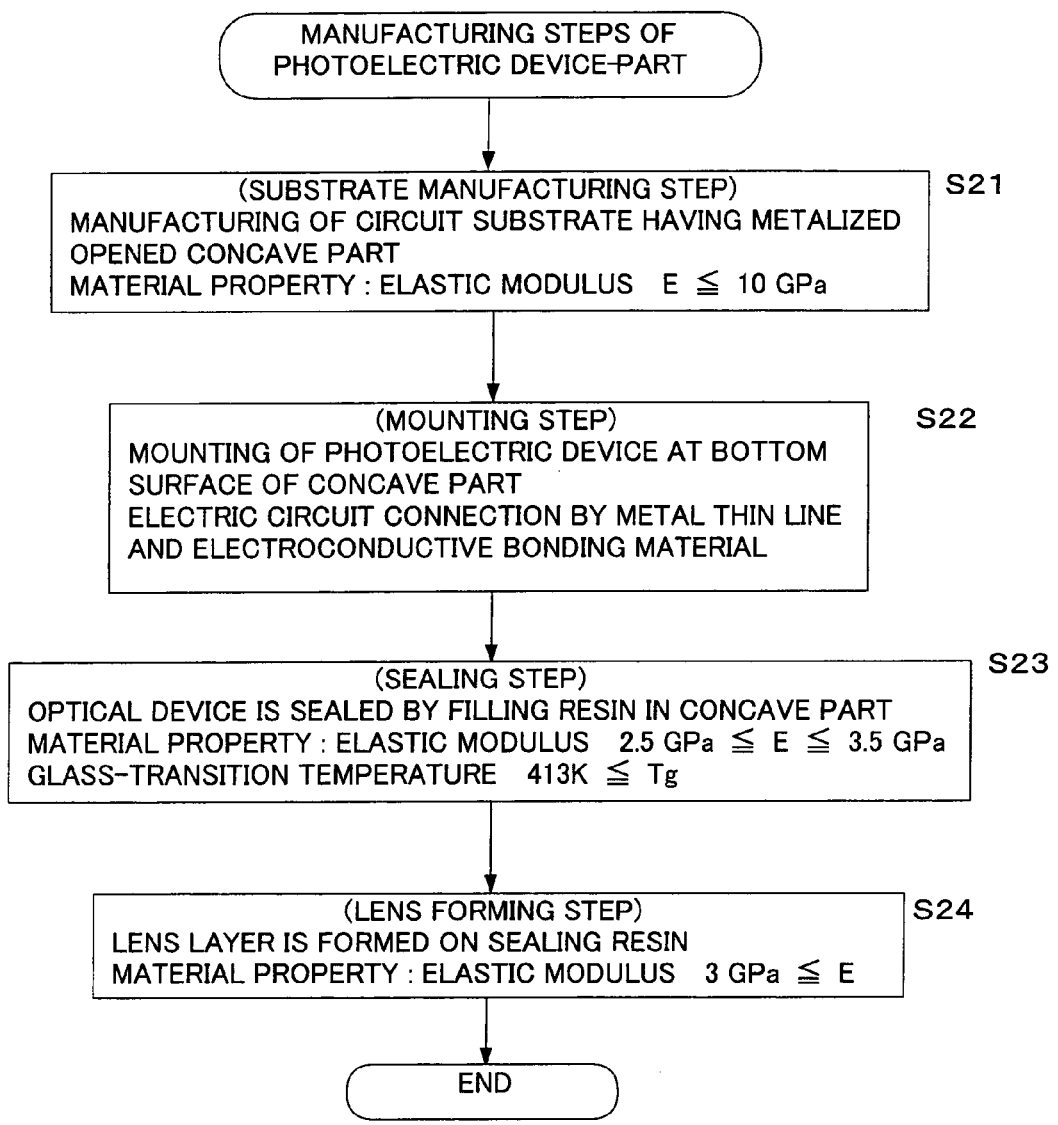
FIG. 12 is a view showing a flow of steps of a manufacturing method of the above photoelectric device-part.

Then, still another photoelectric device-part according to one embodiment of the present invention will described. FIG. 11A is a plan view showing a state in which a sealing resin layer of a photoelectric device-part 30 is removed and FIG. 11B illustrates a sectional view of a concave part in which the photoelectric device 5 is mounted. FIG. 12 illustrates a flow of manufacturing steps of the photoelectric device-part 30. The photoelectric device-part 30 includes a sealing resin layer 18 and a lens layer 15. Other constitution is the same as either one of the photoelectric device-part 10 or the photoelectric device-part 20.

A material and manufacturing steps of the photoelectric device-part 30 will be described. The substrate material of a circuit substrate 1 is manufactured by resin molding using the resin formed of low elastic modulus resin whose elastic modulus is 10 GPa or less as described above and patterns are formed in an inner surface and an outer surface of a concave part as described above at step S21. Then, the photoelectric device 5 is mounted and connected to an electric circuit as described above at step S22. Then, a sealing resin layer 18 is formed by filling sealing resin whose elastic modulus is 2.5 GPa or more and 3.5 GPa or less and glass-transition temperature is 413 K or more to the concave part 2 at step S23. As the sealing resin, in addition to epoxy resin, modified acrylate resin may be used, for example. Then, a lens layer 15 is formed of resin whose elastic modulus is 3 GPa or more on the sealing resin layer 18 at step S24. As the resin of the lens layer 15, in addition to the epoxy resin, the modified acrylate resin may be use for example. If as a method of forming the lens layer 15 a transfer molding method used, for example, a configuration and surface precision of the lens layer 15 can be molded with high precision.

A thermal shock test was performed on the photoelectric device-part 30 manufactured by the above steps. As a comparative example, there was manufactured a photoelectric device-part having a single sealing structure in which the photoelectric device 5 was sealed and the lens layer was formed with only the resin for the lens layer. Then, the same thermal shock test was performed on this comparative example. Material properties and hardening conditions of the resin used are shown in a table 3.

TABLE 3

Material properties and hardening conditions of used resin

| | Resin | Elastic modulus | Glass-transition temperature | Hardening conditions |
|---|---|---|---|---|
| Lens part | Epoxy | 3200 MPa | 398 K | 423 K 180 seconds |
| Sealing resin layer | Epoxy | 3200 MPa | 423 K | 408 K 2 hours |

The thermal shock test was performed in a liquid phase. One cycle was such that 233 K (−40° C.)×5 minutes and 358 K (85° C.)×5 minutes. As a result of the thermal shock test, the multilayer photoelectric device-part 30 according to the present invention were all nondefective out of twenty after 500 cycles. Meanwhile, according to the comparative example of the single structure with the lens layer resin, separation occurred between the lens forming resin and the photoelectric device and all were defective before 500 cycles.

As described above, in the photoelectric device-part 30 having two-layer structure of the sealing resin layer and the lens layer, stress of the sealing resin is comprehensively relieved by selectively and appropriately selecting the elastic modulus of the resin to be filled in the upper space of the photoelectric device. Furthermore, by a synergistic effect with the interlace bonding force, there can be provided the photoelectric device-part with high resistance reliability in which a vacuum void in the resin and separation of the resin interface will not occur in a temperature circumstance of −40° C. to 85° C. at which the photoelectric device-part was put.

As described above, even if the sealing resin can be used with the resin substrate formed of resin whose elastic modulus exceeds 10 GPa without any problem, if such a sealing resin is used with the low elastic modulus resin substrate whose elastic modulus is 10 GPa or less, separation is likely to occur at an interface between the photoelectric device and the sealing resin layer at the tine of heating and cooling of lens resin molding or the like. Then, if the sealing resin layer having high elastic modulus is used to prevent separation between the photoelectric device and the sealing resin layer, an electroconductive bonding agent between the photoelectric device and the circuit substrate is likely to be separated and also the photoelectric device is likely to be damaged. Thus, when the low elastic modulus resin subsume having a material property whose elastic modulus is 10 GPa or less is used, a significant effect can be obtained by the above structure.

Figure 13A:
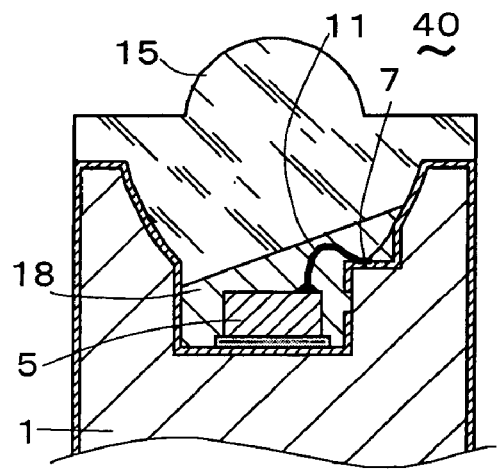
FIG. 13A is a sectional view showing still another photoelectric device-parts according to one embodiment of the present invention.
Figure 13B:
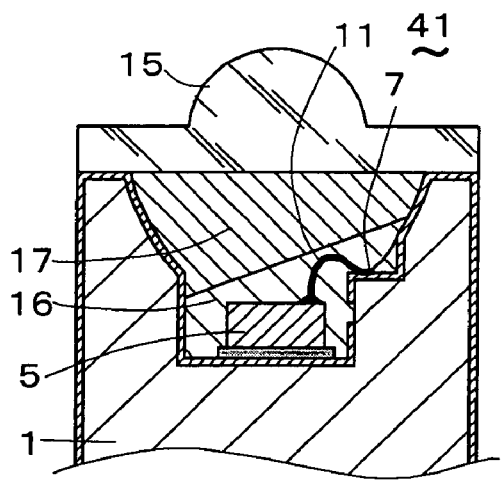
FIG. 13B is a sectional view showing still another photoelectric de parts according to one embodiment of the present invention.
Figure 13C:
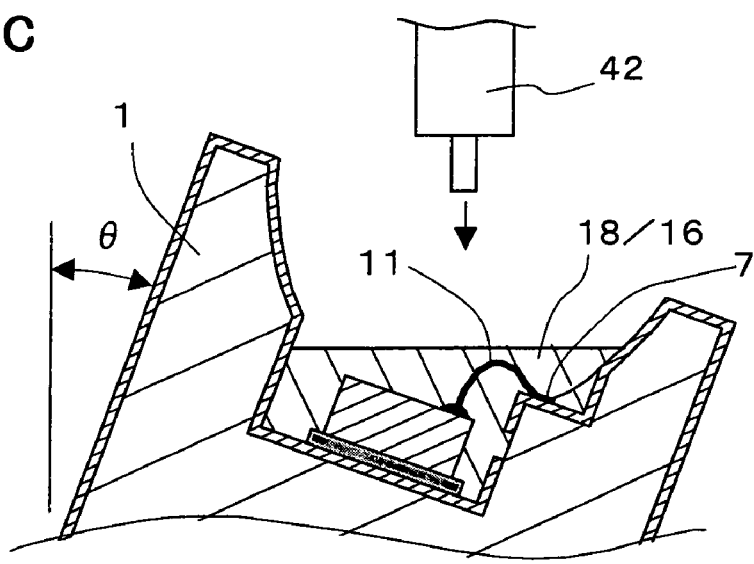
FIG. 13C is a sectional view showing a manufacturing method of the above photoelectric device-parts.

Then, still another photoelectric device-part according to one embodiment of the present invention will be described. FIGS. 13A and 13B illustrated sectional views of different photoelectric device-parts and FIG. 13C illustrates a manufacturing method. A photoelectric device-part 40 has one sealing resin layer as in the photoelectric device-part 30 shown in FIG. 11 and a photoelectric device-part 41 has two sealing resin layers as in the photoelectric device-part 20 shown in FIG. 9. However, they are different from those in that an upper surface of a sealing resin layer 18 or a first sealing layer 16 for sealing a photoelectric device 5 and a bonding wire 11 is slanted so as to be higher on the side of a bonding pad 7.

As shown in FIG. 13C, the upper surface structure of the sealing resin layer is formed by slanting the circuit substrate 1 on which the photoelectric device 5 was mounted at a predetermined angle θ and by dropping the sealing resin from a dispenser 42. After the sealing resin was hardened, the steps until the lens layer 15 is formed are performed by any one of above-mentioned methods.

The sealing resin layer 18 and die first sealing layer 16 of the photoelectric device-parts 40 and 41, respectively are formed to be high at least to the extent that the bonding wire 11 is buried. As the resin for the lens layer 15, any one of the above-mentioned resins or a general resin for the lens is used. The resin for the lens has elastic modulus higher an that of the sealing resin. As this combination, for example, the sealing resin such as Nippon Pelnox Corporaton ME-514 or XN-2880-1 (elastic modulus 2500 to 2550 MPa) and the resin for the lens such as Matsushita Electric Works, Ltd. CV1051 or CV1070 (elastic modulus 3200 MPa) are used.

In view of light emitting and receiving efficiency, since the above resin for the lens has good optical characteristics, this is preferably used as the sealing resin. However, since the linear expansion coefficient of the resin for the lens is considerably higher than tat of the photoelectric device 10 in general, when the photoelectric device is sealed with the resin for the lens, thermal stress acts on the photoelectric device 10. For example, while the linear expansion coefficient of the photoelectric device is generally 5 to 15 ppm, the linear expansion coefficient of the resin for the lens is 68 to 200 ppm. In addition, since the elastic modulus of the resin for the lens is relatively high, when the photoelectric device 5 is sealed with only the lens layer 15, damage such as a crack sometimes occurs in the photoelectric device 5 because of the thermal stress. Then, the stress caused by heat can be relieved by sealing the photoelectric device 5 with the sealing resin having the small elastic modulus fiat and then, laminating the lanes layer 21 having the elastic modulus higher than that. These respects are shown from the result of the thermal shock test on the above-mentioned photoelectric device-part.

Referring to a ratio of the thickness of the sealing resin layer 18 to that of the lens layer 15 in the photoelectric device 40, the thickness of the lens layer 15 is preferably larger an the other in view of improvement of the light usability efficiency. However, if the sealing resin layer 18 is too scarce, the bonding reliability of the bonding wire 11 could be lowered. Especially, if the bonding wire 11 is exposed from the sealing resin layer 18, the bonding wire 11 is likely to be cut because of a difference of thermal expansion coefficients between the sealing resin layer 18 and the lens layer 15. Then, as shown in FIG. 13, the bonding wire 11 and the photoelectric device 5 can be sealed with a small amount of resin by slanting the upper surface of the sealing resin layer so as to be higher on the side of the bonding pad 7. Thus, according to the photoelectric device-parts 40 and 41, the stress to the photoelectric device 5 and the bonding wire 11 can be lowered and its reliability and light usability efficiency are improved.

Another example of a manufacturing method of layering the sealing resin layers will be described. For example, the resin for the lower layer is dropped and then, the resin for the upper layer whose specific gravity is smaller than that of the resin for the lower layer is dropped thereon. Then, they are hardened. According to his method, since the interface of the two sealing resin layers is formed in a liquid state, they are melted with each other. As a result, the bonding force is improved because the interface of the resins is chemically bonded when the two sealing resin layers are hardened. Since the resin having specific gravity smaller than that of the resin for the lower layer is used for the upper layer, the resins are not mixed.

A thermal shock test was performed on the photoelectric device-part which was manufactured by the above method. More specifically, the photoelectric device-part was manufactured by dropping the resin for the first sealing layer (lower layer) using the resin shown in the above table 2, dropping the resin having specific gravity smaller than t of the above resin for the second sealing layer (upper layer) without hardening the first resin, irradiating UV under a condition of 6 J/cm2, and then, hardening both resins. The thermal shock test was performed on the photoelectric device-part manufactured by the above method and on the photoelectric device-part manufactured by a normal method. As a rest, the interface between the fist and second layers of the sample manufactured by the normal method is separated and becomes defective after 1000 cycles. The it between the first and second layers of the sample manufactured by the above method was not separated and all were nondefective.

Figure 14A:
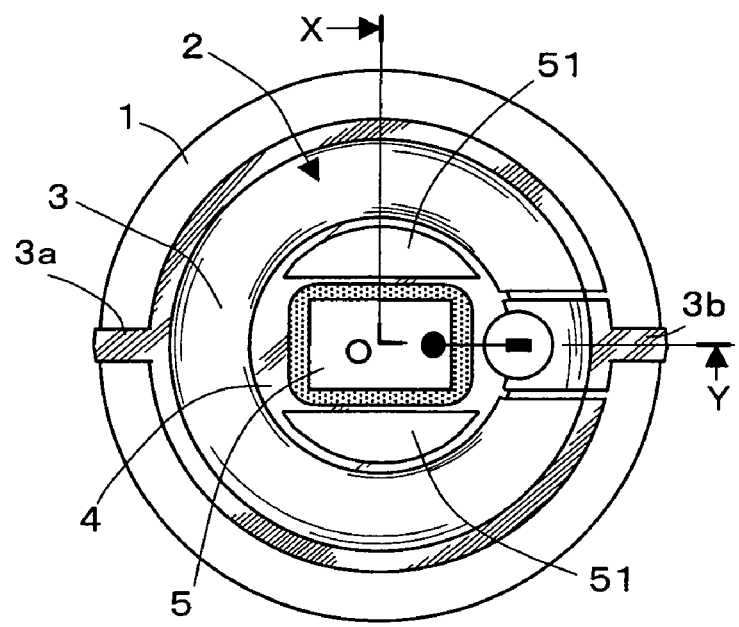
FIG. 14A is a plan view showing still another photoelectric device-part according to one embodiment of the present invention from which a seating resin layer is removed.
Figure 14B:
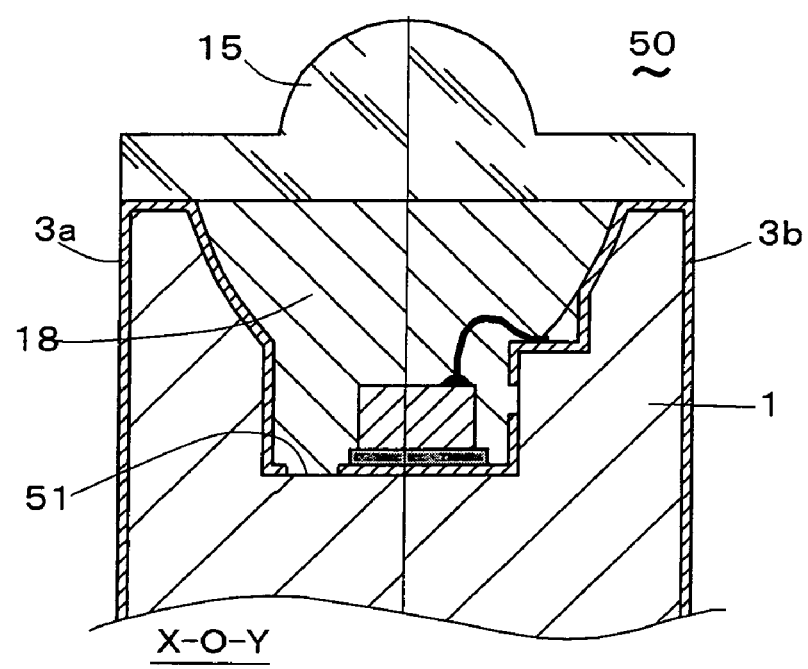
FIG. 14B is a sectional view taken along line XOY of the photoelectric device-part.

Then, still another photoelectric device-part according to one embodiment of the present invention will be described. FIG. 14A illustrates a plan view showing a state the sealing resin layer of a photoelectric device-part 50 is removed and FIG. 14B illustrates a tonal view showing a concave part on which a photoelectric device 5 is mounted. According to the photoelectric device-part 50, a portion in which the resin of the substrate material is exposed, for example, a lunate portion 51 where substrate resin is exposed is formed on a bottom surface 4 of the concave part 2 metalized for forming a light reflecting surface 3 and wirings 3$a$ and 3$b$. According to this structure, a sealing resin 18 to be filled in the concave part 2 and the resin of the substrate material of the circuit substrate 1 are directly connected to each other at the exposed portion. Therefore, stronger bonding force of the sealing resin is provided as compared with the bonding through the met surface. For example, the photoelectric device-part 50 formed using the resin shown in the table 2 and shown in FIG. 14 were all nondefective after 1000 cycles of the thermal shock test. The sample in which the bottom surface is all metalized became defective because of separation.

Figure 15A:
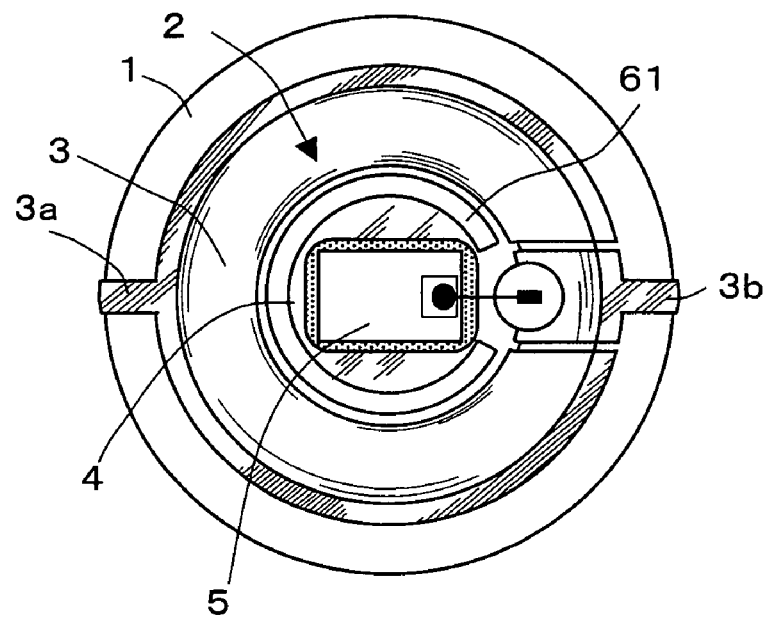
FIG. 15A is a plan view showing still another photoelectric device-pail according to one embodiment of the present invention from in which a sealing resin layer is removed.
Figure 15B:
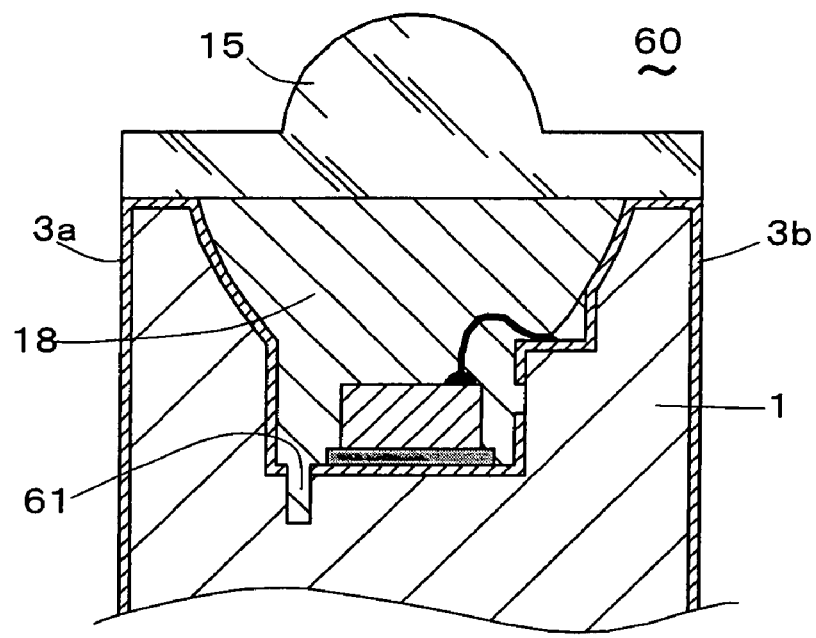
FIG. 15B is a sectional view showing the photoelectric device-part.

Then, still another photoelectric device-part according to one embodiment of the present invention will be described. FIG. 15A illustrates a plan view showing a state in which the sealing resin layer of a photoelectric device-part 60 is removed and FIG. 15B illustrates a sectional view showing a concave part on which a photoelectric device 5 is mounted. According to the photoelectric device-part 60, in addition to the above exposed structure of the substrate resin a groove 61 is formed in the exposed portion. According to this structure, since the sealing resin layer 18 is implanted in the grove 61, in addition to the above effect, since a bonding area between the sealing resin layer 18 and the resin of the substrate material of the circuit substrate 1 is increased and further stronger bonding force of the sealing resin can be obtained. For example, the photoelectric device-part 60 manufactured using the resin shown in the table 2 were all nondefective after 1500 cycles of the thermal shock test, while the sample without the groove became defective because of separation.

Then, still another example of a method of forming a lens layer will be described. For example, a resin for forming the lens part is filled under the condition that the degree of cross-linking of a sealing resin is 50 to 80% and the resin was hardened to form the lens layer. According to this method, the sealing resin for the lower layer of the lens layer is hardened by a hardening agent for the lens resin and chemical bonding between the lens resin and the sealing resin is formed. Therefore, the bonding force between the lens layer and the sealing resin layer is improved. In addition, the degree of cross-linking of the sealing resin may be controlled by heating time while the resin is hardened, More specifically, the degree of cross-linking is easily controlled or changed by changing the heating time when the photoelectric device-part is manufactured.

The thermal shock test was performed on the photoelectric device-part manufactured by the above method. For example, the photoelectric device-part was manufactured by heating the sealing resin layer in a constant temperature bath at 408 K for 30 minutes to form cross-linking by 70% using the resin shown in the table 3 and forming the lens layer on the sealing resin layer. As a result of the dial shock test on this photoelectric device-part there is no defective one after 1000 cycles. As a comparative example, a photoelectric device-part was formed by heating at 408 K for 2 hours to form the cross-linking by 85% and forming a lens layer thereon. The sample in the comparative example became defective because of separation of the interface between the sealing resin and the lens resin in the thermal shock test after 1000 cycles. In addition, when a lens was formed on the sealing resin layer which was heated at 408 K for 15 minutes to form the cross-linking by 45% by resin molding, the sealing resin was floated by pressure at the time of the resin molding to become defective.

Figure 16A:
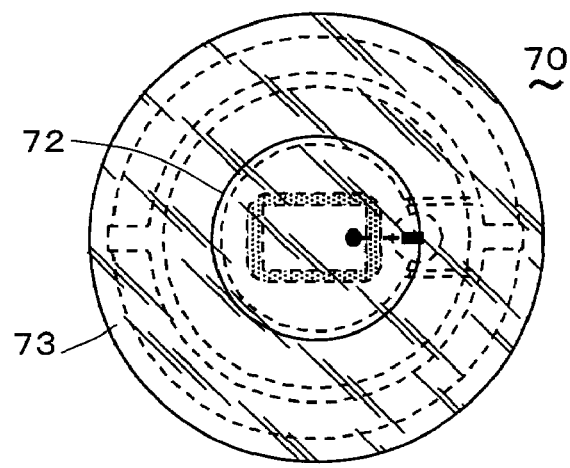
FIG. 16A is a plan view showing still another photoelectric device-part according to one embodiment of the present invention.
Figure 16B:
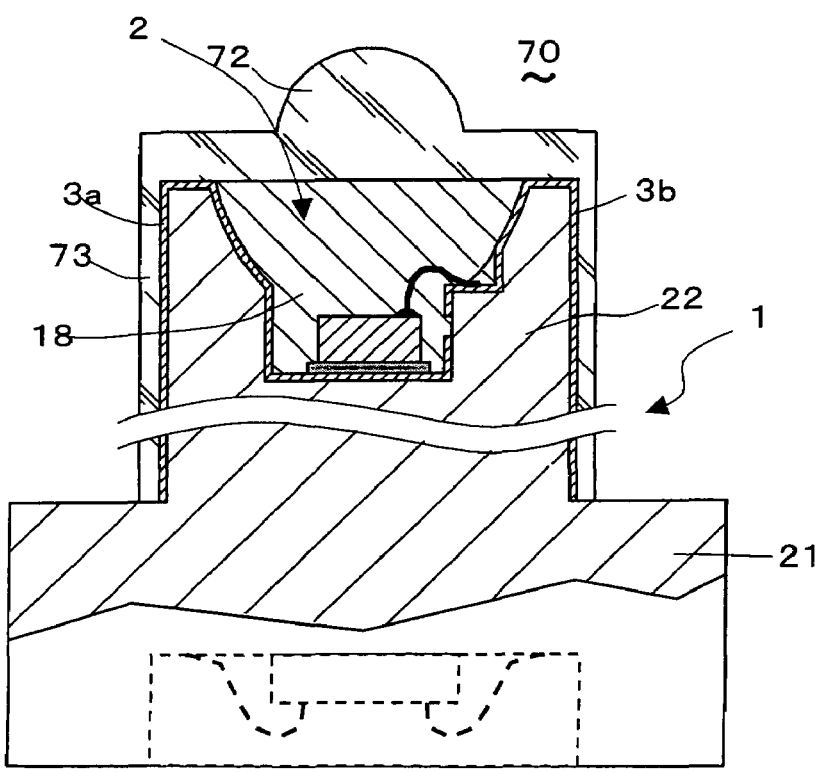
FIG. 16B is a sectional view showing the photoelectric device-part.
Figure 17A:
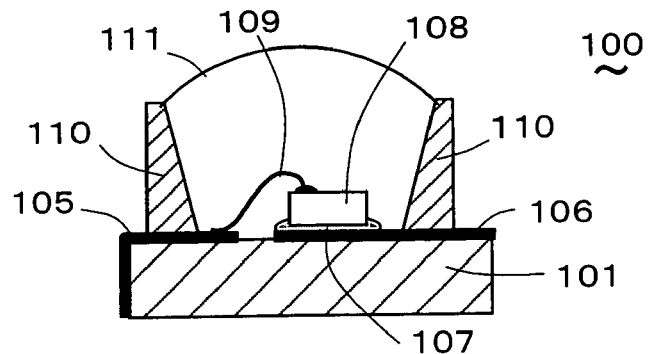
FIG. 17A is sectional view showing conventional photoelectric device-parts.
Figure 17B:
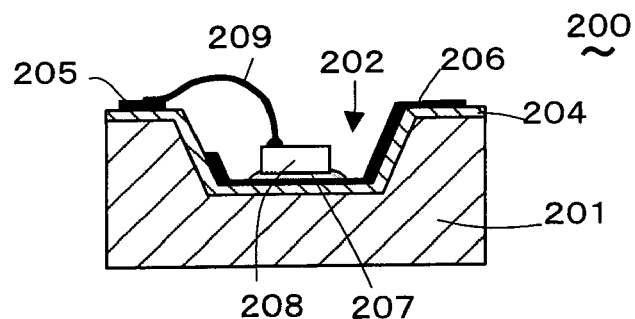
FIG. 17B is sectional view showing conventional photoelectric device-parts.
Figure 17C:
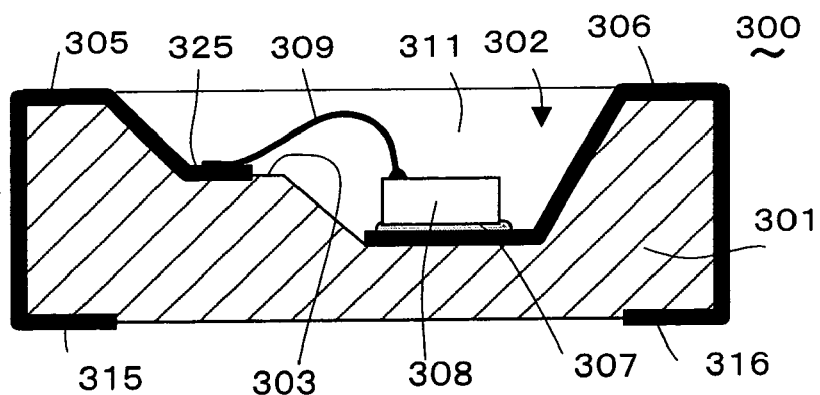
FIG. 17C is sectional view showing conventional photoelectric device-parts.

Then, still another photoelectric device-part according to one embodiment of the present invention will be described FIG. 16A illustrates a plan view showing the photoelectric device-part and FIG. 16B illusions its sectional view. A concave part 2 on which a photoelectric device 5 is mounted is provided at a top of a columnar body 22 projecting from a circuit substrate 1 as in the photoelectric device-part 20 shown in FIG. 7. After the photoelectric device 5 was mounted, the sealing resin layer 18 is filled and hardened and then, a lens layer 72 having a resin 73 is formed so as to cover the outer surface of the projecting columnar body 22. According to the photoelectric device-part 70, since the resin constituting the lens layer 72 covers the outer surface of the projecting columnar body 22, it is not necessary to form a layer for protecting an electrical connection circuit on the outer surface separately. As a result, the electrical connection circuit on the outer surface can be surely covered and protected by the extended lens layer resin having no boundary. Furthermore, there can be provided a large space for the bonding interface between the lens resin and circuit substrate resin. Therefore, moisture absorption to the inside of the sealing part through the interface can be reduced and the photoelectric device can be prevented from deteriorating. Still further, since the inner sealing resin layer is surrounded by the resin for the lens layer rigidly formed, separation between the sealing resin layer and the lens layer can be prevented.

The thermal shock test was performed on the above-mentioned photoelectric device-part 70. The used materials were the same as that shown in the table 2. The photoelectric device-part 70 was manufactured by molding the lens resin on the outer side of the columnar body 22 by transfer molding. As a result of the thermal shock test performed 1000 cycles on the photoelectric device-part 70, separation between the resins of the lens layer and the circuit substrate did not occur. As the comparative example, the thermal shock test was performed 1000 cycles on a photoelectric device-part in which a lens part is molded only at an upper portion of the columnar body. According to this comparative sample, the interface between the lens resin and the circuit substrate resin was separated to become defective.

Then, still another example of a method of forming the lens layer will be described. For example, in the process the lens is formed, after the resin forming the lens part was hardened, it is cooled down from the hardening temperature to a room temperature at cooling speed lower than that of the room temperature cooling. According to is method, it can be cooled down while thermal stress is reduced by controlling the cooling time. Therefore, the separation of the resin interface or a crack in the resin caused by rapid shrinkage can be prevented from occurring. For example, after the lens layer was molded using the resin shown in the table 2 and hardened at 423 K, a sample of the photoelectric device-part was taken out of the mold, put in the constant temperature bath and cooled down by 1 K per minute to 300 K. As the result of the thermal shock test performed 1000 cycles on this sample, there was no defective sample.

In addition, the present invention is not limited to the above constitutions and can be changed. For example, the above-mentioned structures of the sealing resin layer and the lens layer may be combined with each other to constitute the photoelectric device-part.

The present disclosure relates to subject matter contained in Japanese Patent Application Nos. 2002-215948, filed on Jul. 25, 2002, and 2003-019478, filed on Jan. 28, 2003, the contents of both are herein expressly incorporated by reference in their entireties.

What is claimed is:

1. A photoelectric device-part having a metalized light reflecting surface including a slanting curved surface provided around almost the whole periphery of a light axis for light emission/reception by a photoelectric device, comprising:
    a circuit substrate in which a concave part for housing said photoelectric device is formed;
    a photoelectric device mounted on a bottom surface of said concave part; and
    a resin layer for sealing the photoelectric device,
    wherein said light reflecting surface is provided on an inner surface including a slanting curved surface forming said concave part,
    a convex portion projecting from a position of said light reflecting surface and receding concave portion projecting into said light reflecting surface are sequentially formed in this order from the bottom surface of said concave part in the middle of said concave part at a part of said light reflecting surface in the peripheral direction and a stage is formed by an upper surface of the convex portion and a bottom surface of the concave portion,
    wherein said stage is formed at less than a complete circumference of the inner surface, and
    a bonding pad for connecting circuits of the photoelectric device is provided at said stage.

2. A photoelectric device-part according to claim 1, wherein an insulating part for insulating said bonding pad in the vicinity of the convex portion of said stage from other electric circuits is formed at a surface part continuing from the top of said convex portion to the bottom surface of the concave part for housing the photoelectric device.

3. A photoelectric device-part according to claim 2, wherein said insulating part is formed by laser.

4. A photoelectric device-part according to claim 1, wherein said stage is nearly a circle/oval.

5. A photoelectric device-part according to claim 1, wherein said concave part for housing the photoelectric device is provided at a top of a projecting columnar body and electric connection circuits connected to said bonding pad go through the top and an outer surface of said columnar body.

6. A photoelectric device-part having a metalized light reflecting surface including a slanting curved surface provided around almost the whole periphery of a light axis for light emission/reception by a photoelectric device, comprising:
    a circuit substrate in which a concave part for housing said photoelectric device is formed;
    a photoelectric device mounted on a bottom surface of said concave part; and
    a resin layer for sealing the photoelectric device,
    wherein said light reflecting surface is provided on an inner surface including a slanting curved surface forming said concave part,
    a convex portion projecting from a position of said light reflecting surface and receding concave portion are sequentially formed in this order from the bottom surface of said concave part in the middle of said concave part at a part of said light reflecting surface in the peripheral direction and a stage is formed by an upper surface of the convex portion and a bottom surface of the concave portion, and
    a bonding pad for connecting circuits of the photoelectric device is provided at said stage,
    wherein said photoelectric device is connected to said bonding pad through a bonding wire, said sealing resin layer is formed to be high to the extent that the bonding wire is buried, and a lens layer is formed by a resin for a lens having elastic modulus larger than that of the sealing resin layer so as to cover the sealing resin layer.

7. A photoelectric device-part according to claim 6, wherein an upper surface of said sealing resin layer is a slanting curved surface so as to be higher on the side of the bonding pad.

8. A photoelectric device-part according to claim 1, comprising a portion in which a substrate material of said circuit substrate is exposed on the bottom surface of said concave part for housing the photoelectric device.

9. A photoelectric device-part according to claim 8, wherein a groove in which said substrate material is exposed is formed at the bottom surface of said concave part for housing the photoelectric device and the sealing resin is poured in the groove.

10. A photoelectric device-part having a metalized light reflecting surface including a slanting curved surface provided around almost the whole periphery of a light axis for light emission/reception by a photoelectric device, comprising:
    a circuit substrate in which a concave part for housing said photoelectric device is formed;
    a photoelectric device mounted on a bottom surface of said concave part; and
    a resin layer for sealing the photoelectric device,
    wherein said light reflecting surface is provided on an inner surface including a slanting curved surface forming said concave part,
    a convex portion projecting from a position of said light reflecting surface and receding concave portion are sequentially formed in this order from the bottom surface of said concave part in the middle of said concave part at a part of said light reflecting surface in the peripheral direction and a stage is formed by an upper surface of the convex portion and a bottom surface of the concave portion, and
    a bonding pad for connecting circuits of the photoelectric device is provided at said stage,
    wherein said concave part for housing the photoelectric device is provided at a top of a projecting columnar body, a lens layer is formed with a resin for the lens having elastic modulus higher than that of the sealing resin layer so as to cover said sealing resin layer, and the resin for the lens covers an outer surface of said projecting columnar body.

11. A photoelectric device-part having a metalized light reflecting surface including a slanting curved surface provided around almost the whole periphery of a light axis for light emission/reception by a photoelectric device, comprising:
    a circuit substrate in which a concave part for housing said photoelectric device is formed;
    a photoelectric device mounted on a bottom surface of said concave part; and
    a resin layer for sealing the photoelectric device,
    wherein said light reflecting surface is provided on an inner surface including a slanting curved surface forming said concave part,
    a convex portion projecting from a position of said light reflecting surface and receding concave portion are sequentially formed in this order from the bottom surface of said concave part in the middle of said concave part at a part of said light reflecting surface in the peripheral direction and a stage is formed by an upper surface of the convex portion and a bottom surface of the concave portion, and a bonding pad for connecting circuits of the photoelectric device is provided at said stage, wherein a lens layer is formed with a resin for a lens having elastic modulus higher than that of said sealing resin layer so as to cover the sealing resin layer, the lens layer is formed by hardening the resin for the lens and cooled down from a hardening temperature to a room temperature at cooling speed lower than that of a room temperature cooling.

12. A photoelectric device-part having a metalized light reflecting surface including a slanting curved surface provided around almost the whole periphery of a light axis for light emission/reception by a photoelectric device, comprising:

a circuit substrate in which a concave part for housing said photoelectric device is formed;

a photoelectric device mounted on a bottom surface of said concave part; and a resin layer for sealing the photoelectric device, wherein said light reflecting surface is provided on an inner surface including a slanting curved surface forming said concave part, a convex portion projecting from a position of said light reflecting surface and receding concave portion are sequentially formed in this order from the bottom surface of said concave part in the middle of said concave part at a part of said light reflecting surface in the peripheral direction and a stage is formed by an upper surface of the convex portion and a bottom surface of the concave portion, and a bonding pad for connecting circuits of the photoelectric device is provided at said stage, wherein said substrate material of the circuit substrate is formed with a resin having low elastic modulus of 10 GPa or less, said sealing resin layer comprises a first sealing layer for sealing said photoelectric device by a resin whose elastic modulus is 1 Pa or more and 1 Mpa or less and glass-transition temperature is 213 K or more and 233 K or less; and a second sealing layer formed on said first sealing layer with an ultraviolet ray hardening resin whose elastic modulus is 1 GPa or more and 2.5 GPa or less and glass-transition temperature is 413 K or more, and a lens layer is formed on said second sealing layer with a resin for a lens whose elastic modulus is 3 GPa or more.

13. A photoelectric device-part according to claim 12, wherein said first sealing layer and said second sealing layer are formed by dropping the resin for the first sealing layer, dropping the resin for the second sealing layer whose specific gravity is smaller than that of the resin for the first sealing layer thereon, and hardening those resins.

14. A photoelectric device-part having a metalized light reflecting surface including a slanting curved surface provided around almost the whole periphery of a light axis for light emission/reception by a photoelectric device, comprising:

a circuit substrate in which a concave part for housing said photoelectric device is formed;

a photoelectric device mounted on a bottom surface of said concave part; and a resin layer for sealing the photoelectric device, wherein said light reflecting surface is provided on an inner surface including a slanting curved surface forming said concave part, a convex portion projecting from a position of said light reflecting surface and receding concave portion are sequentially formed in this order from the bottom surface of said concave part in the middle of said concave part at a part of said light reflecting surface in the peripheral direction and a stage is formed by an upper surface of the convex portion and a bottom surface of the concave portion, and a bonding pad for connecting circuits of the photoelectric device is provided at said stage, wherein said substrate material of the circuit substrate is formed with a resin having low elastic modulus of 10 GPa or less, said sealing resin layer is formed with a resin whose elastic modulus is 2.5 GPa or more and 3.5 GPa or less and glass-transition temperature is 413 K or more, and a lens layer is formed with a resin for a lens whose elastic modulus is 3 GPa or more, on said sealing resin layer.

15. A photoelectric device-part according to claim 14, wherein said sealing resin layer and said lens layer are formed by dropping the resin for said sealing resin layer, filling the resin for the lens under the condition that the degree of cross-linking of the resin for the sealing resin layer is 50 to 80% and hardening those resins.

* * * * *